US009362418B2

(12) United States Patent
Tang et al.

(10) Patent No.: US 9,362,418 B2
(45) Date of Patent: Jun. 7, 2016

(54) SEMICONDUCTOR STRUCTURES INCLUDING BODIES OF SEMICONDUCTOR MATERIAL AND METHODS OF FORMING SAME

(71) Applicant: Micron Technology, Inc., Boise, ID (US)

(72) Inventors: Sanh D. Tang, Boise, ID (US); David H. Wells, Boise, ID (US); Tuman E. Allen, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/606,415

(22) Filed: Jan. 27, 2015

(65) Prior Publication Data
US 2015/0137214 A1    May 21, 2015

Related U.S. Application Data

(60) Continuation of application No. 14/176,780, filed on Feb. 10, 2014, now Pat. No. 8,987,108, which is a division of application No. 13/175,507, filed on Jul. 1, 2011, now Pat. No. 8,648,414.

(51) Int. Cl.
*H01L 29/792* (2006.01)
*H01L 21/02* (2006.01)
(Continued)

(52) U.S. Cl.
CPC ........ *H01L 29/792* (2013.01); *H01L 21/02532* (2013.01); *H01L 21/28282* (2013.01); *H01L 21/76224* (2013.01); *H01L 21/76232* (2013.01); *H01L 21/84* (2013.01); *H01L 27/1021* (2013.01); *H01L 27/1027* (2013.01); *H01L 27/11521* (2013.01); *H01L 27/11568* (2013.01);
*H01L 27/1203* (2013.01); *H01L 29/0653* (2013.01); *H01L 29/16* (2013.01); *H01L 29/161* (2013.01); *H01L 29/517* (2013.01);
(Continued)

(58) Field of Classification Search
None
See application file for complete search history.

(56) References Cited

U.S. PATENT DOCUMENTS 5,024,965 A    6/1991 Chang et al.
5,869,373 A    2/1999 Wen et al.
(Continued)

FOREIGN PATENT DOCUMENTS

JP    2007081434 A    3/2007

OTHER PUBLICATIONS

Russo et al., "Non-Volatile Memory Technology Overview," Numonyx R/D Technology Development, Sep. 2, 2010, 43 pages.

*Primary Examiner* — Joseph Schoenholtz
(74) *Attorney, Agent, or Firm* — TraskBritt

(57) ABSTRACT

Semiconductor structures that include bodies of a semiconductor material spaced apart from an underlying substrate. The bodies may be physically separated from the substrate by at least one of a dielectric material, an open volume and a conductive material. The bodies may be electrically coupled by one or more conductive structures, which may be used as an interconnect structure to electrically couple components of memory devices. By providing isolation between the bodies, the semiconductor structure provides the properties of a conventional SOI substrate (e.g., high speed, low power, increased device density and isolation) while substantially reducing fabrication acts and costs associated with such SOI substrates. Additionally, the semiconductor structures of the present disclosure provide reduced parasitic coupling and current leakage due to the isolation of the bodies by the intervening dielectric material.

21 Claims, 14 Drawing Sheets

(51) Int. Cl.
- *H01L 21/28* (2006.01)
- *H01L 21/762* (2006.01)
- *H01L 29/06* (2006.01)
- *H01L 29/16* (2006.01)
- *H01L 29/161* (2006.01)
- *H01L 29/51* (2006.01)
- *H01L 29/66* (2006.01)
- *H01L 27/112* (2006.01)
- *H01L 21/84* (2006.01)
- *H01L 27/102* (2006.01)
- *H01L 29/788* (2006.01)
- *H01L 27/115* (2006.01)
- *H01L 27/12* (2006.01)
- *H01L 27/108* (2006.01)

(52) U.S. Cl.
CPC ........ *H01L29/518* (2013.01); *H01L 29/66825* (2013.01); *H01L 29/66833* (2013.01); *H01L 29/7881* (2013.01); *H01L 27/10802* (2013.01)

(56) References Cited

U.S. PATENT DOCUMENTS

| | | |
|---|---|---|
| 5,963,789 A | 10/1999 | Tsuchiaki |
| 5,972,758 A | 10/1999 | Liang et al. |
| 6,232,202 B1 | 5/2001 | Hong |
| 6,376,286 B1 | 4/2002 | Ju |
| 6,551,937 B2 | 4/2003 | Jun et al. |
| 7,445,973 B2 * | 11/2008 | Gonzalez ............... H01L 21/84 257/E21.209 |
| 7,476,933 B2 | 1/2009 | Juengling |
| 7,537,994 B2 | 5/2009 | Taylor et al. |
| 7,560,359 B2 | 7/2009 | Park |
| 7,589,995 B2 | 9/2009 | Tang et al. |
| 7,892,896 B2 | 2/2011 | Shim |
| 7,981,303 B2 | 7/2011 | Bring et al. |
| 8,158,471 B2 | 4/2012 | Mathew et al. |
| 8,288,795 B2 | 10/2012 | Tang |
| 2004/0110383 A1 | 6/2004 | Tanaka |
| 2006/0220108 A1 | 10/2006 | Hashimoto |
| 2006/0292787 A1 | 12/2006 | Wang et al. |
| 2007/0063282 A1 | 3/2007 | Yang et al. |
| 2008/0188051 A1 | 8/2008 | Wells |
| 2008/0305613 A1 | 12/2008 | Pelella et al. |
| 2009/0050867 A1 | 2/2009 | Wells et al. |
| 2009/0095997 A1 | 4/2009 | Wells et al. |
| 2009/0224312 A1 | 9/2009 | Taketani |
| 2010/0171176 A1 | 7/2010 | Wells |
| 2010/0232235 A1 | 9/2010 | Goda |
| 2013/0001682 A1 | 1/2013 | Tang et al. |
| 2014/0206175 A1 | 7/2014 | Tang et al. |

* cited by examiner

US 9,362,418 B2

SEMICONDUCTOR STRUCTURES INCLUDING BODIES OF SEMICONDUCTOR MATERIAL AND METHODS OF FORMING SAME

CROSS-REFERENCE TO RELATED APPLICATIONS

This application is a continuation of U.S. patent application Ser. No. 14/176,780, filed Feb. 10, 2014, now U.S. Pat. No. 8,987,108, issued Mar. 24, 2015, which is a divisional of U.S. patent application Ser. No. 13/175,507, filed Jul. 1, 2011, now U.S. Pat. No. 8,648,414, issued Feb. 11, 2014, the disclosure of each of which is hereby incorporated herein in its entirety by this reference.

TECHNICAL FIELD

Embodiments of the present invention relate to semiconductor structures comprising bodies of semiconductor material separated from a substrate, devices including such structures, and methods for forming such structures.

BACKGROUND

Memory devices are conventionally provided as internal, semiconductor, integrated circuits in computers or other electronic devices. There are many different types of memory devices including random-access memory (RAM), read-only memory (ROM), synchronous dynamic random-access memory (SDRAM), dynamic random-access memory (DRAM), and non-volatile memory (e.g., NAND Flash). The trend in the semiconductor industry is toward smaller memory devices that may be used to fabricate high density circuits on a single chip. Miniaturization may be achieved by reducing the size of all the features of surface-oriented devices so that the resultant devices occupy a smaller surface area of a wafer.

Conventional memory devices may include at least one transistor cell used to amplify and switch electronic signals. Such transistor cells may be electrically isolated using shallow trench isolation (STI), for example. With STI, trenches in a substrate are filled with dielectric material to form insulating structures between neighboring transistor cells. The STI structures are formed deep enough to electrically isolate the neighboring cells from each other. However, as transistors are formed on a smaller scale, aspect ratios of the trenches for forming the STI structures increase. As used herein, the term "aspect ratio" means and includes a ratio between a height and a width of a feature, such as a trench in a substrate. As aspect ratios of the trenches are increased, physical stability of the trenches decreases and toppling or other distortion of the substrate in which the trenches are formed becomes a problem. Higher aspect ratios also degrade electrical properties of resulting memory devices due to increased parasitic electrical coupling between neighboring units of a device.

Silicon-on-insulator (SOI) substrates have been used to improve electrical properties of semiconductor memory devices as feature sizes continue to decrease. As used herein, the terms "silicon-on-insulator substrate" or "SOI" mean and include substrates including a silicon material formed over an insulating material (e.g., silicon dioxide or sapphire) overlying another silicon material (also known as bulk silicon). The insulating material provides electrical isolation of the memory cells to be built on or in the top silicon layer from the underlying bulk silicon. This isolation tends to provide lower parasitic capacitance, thus improving power consumption at matched memory performance. Additionally, forming memory cells on an SOI substrate may reduce problems with short circuits that sometimes occur in memory devices, such as those that occur with low-impedance paths inadvertently formed between power supply rails of a metal-oxide-semiconductor field-effect-transistor (MOSFET) and the underlying bulk substrate. This type of short circuit is often referred to as "latchup." Use of an SOI substrate can reduce latchup problems because the bulk substrate is electrically isolated from the power supply rails of the transistors due to the intermediate insulating layer.

Transistors of semiconductor devices, such as MOSFET devices, including their source, channel, drain, gate and ohmic contacts, may be formed in isolated regions of silicon. During operation, such isolated regions of silicon have a tendency to acquire a potential that may interfere with proper function of the transistor. The problem is often referred to as the "floating body" effect. The floating body effect causes high leakage current and parasitic bipolar action in the semiconductor device, resulting in adverse affects on threshold voltage control and circuit operation.

Although SOI substrates improve electrical properties of devices formed thereon compared to conventional semiconductor substrates, their cost is relatively high. In addition, features at a periphery of the devices used for reading, writing, or erasing information in the memory array may take up extra space on the device and require extra processing steps when an SOI substrate is used, also adding to the cost of the final product. Manufacturing memory devices on an SOI substrate also does not necessarily reduce the aforementioned problems associated with high aspect ratios. Therefore, methods of isolating memory cells from the underlying bulk silicon substrate other than conventional methods of manufacturing memory devices on SOI substrates are desirable to reduce cost, improve device performance, and reduce the occurrence and severity of physical defects.

DETAILED DESCRIPTION

Figure 1A:
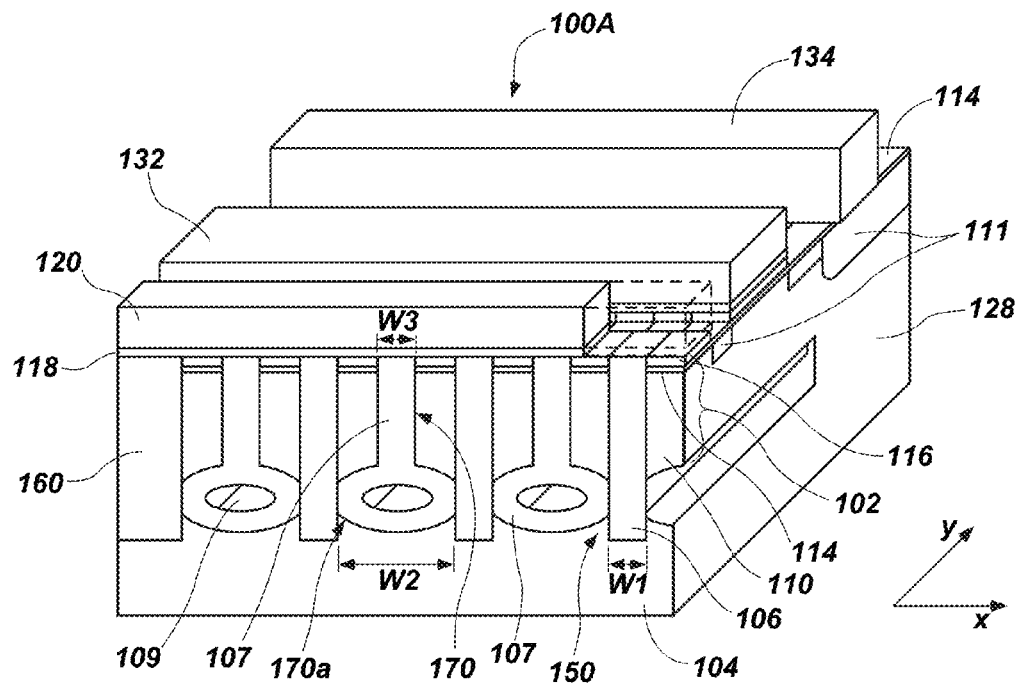
FIGS. 1A through 3 are perspective views illustrating embodiments of semiconductor structures of the present disclosure.

Semiconductor structures that include bodies of semiconductor material spaced apart from the substrate by at least one dielectric material are disclosed, as are methods of forming such semiconductor structures. As used herein, the term "body" means and includes a volume of a semiconductor material. Each of the bodies may be physically separated from an underlying substrate by the at least one dielectric material, an open volume or a conductive material. In some embodiments, the bodies may be aligned with one another in at least one direction to form an array in which each of the bodies is spaced apart from adjacent bodies by the at least one dielectric material. The bodies may be electrically coupled by one or more conductive structures, which may be used as an interconnect structure to electrically couple components of memory devices. By providing isolation between the bodies, the semiconductor structure provides the properties of a conventional silicon-on-insulator (SOI) substrate (e.g., high speed, low power, increased device density and isolation) while substantially reducing fabrication acts and costs associated with such SOI substrates. Additionally, the semiconductor structures of the present disclosure provide reduced parasitic coupling and current leakage due to the isolation of the bodies by the intervening dielectric material. As will be described, the spacing of the semiconductor structures may be controlled during fabrication to improve physical stability. The bodies of semiconductor structures are associated with a common source region and, thus, do not require changes in programming associated with memory devices formed using conventional SOI substrates. By way of example and not limitation, the semiconductor structures described herein may be used to form non-volatile memory (NVM), field effect transistor (FET) devices, floating body cell (FBC) devices and thyristor random access memory (TRAM) devices.

The terms "horizontal" and "vertical," as used herein, define relative positions of elements or structures with respect to a major plane or surface of a wafer or substrate, regardless of the orientation of the wafer or substrate, and are orthogonal dimensions interpreted with respect to the orientation of the structure being described, as illustrated in the drawing being referred to when the structure is being described. As used herein, the term "vertical" means and includes a dimension substantially perpendicular to the major surface of a substrate or wafer as illustrated, and the term "horizontal" means a dimension substantially parallel to the major surface of the substrate or wafer as illustrated and extending between left and right sides of the drawing. Prepositions, such as "on," "over," "above" and "under," as used herein, are relative terms corresponding to the vertical direction with respect to the structure being described.

The following description provides specific details, such as material types and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. The semiconductor structures described below do not form a complete semiconductor device. Only those process acts and structures necessary to understand the embodiments of the present disclosure are described in detail below. Additional acts to form a complete semiconductor device from the semiconductor structures may be performed by conventional fabrication techniques.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, and electrical changes may be made without departing from the scope of the invention. The illustrations presented herein are not meant to be actual views of any particular system, logic device, semiconductor device or memory cell, but are merely idealized representations that are employed to describe the embodiments of the present disclosure. The drawings presented herein are not necessarily drawn to scale.

Figure 1B:
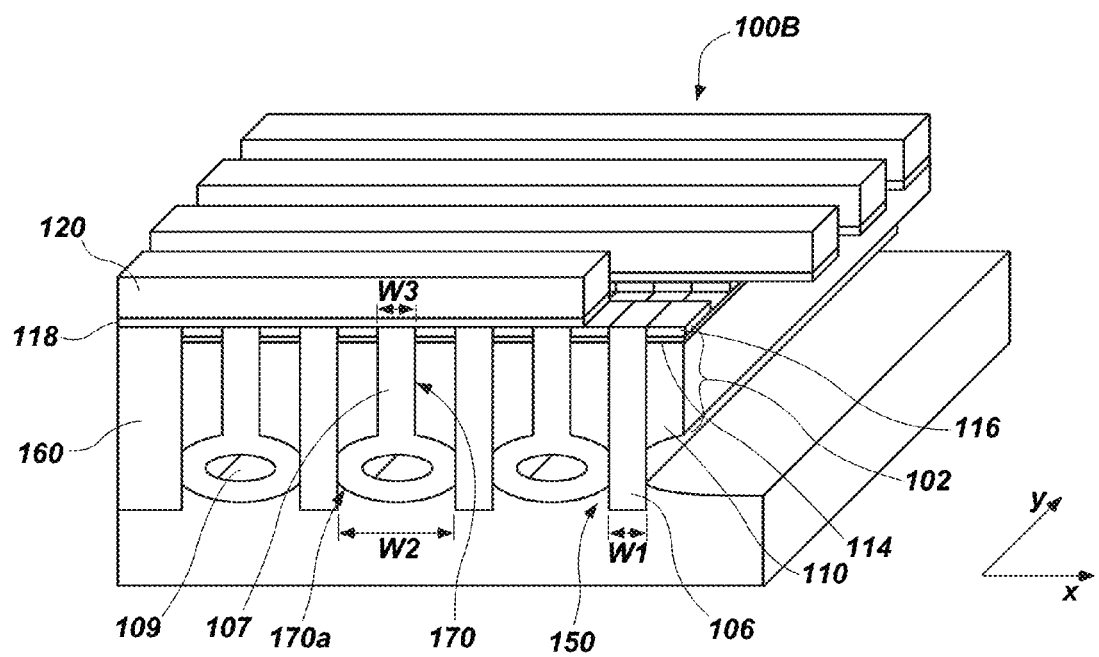

FIGS. 1A and 1B each show an embodiment of a portion of a semiconductor structure 100A, 100B of the present disclosure. The semiconductor structures 100A, 100B each include a plurality of transistors 102 disposed over a substrate 104. For example, the term "substrate" means any structure that includes a semiconductor type material including, for example, silicon, germanium, gallium arsenide, indium phosphide, and other III-V or II-VI type semiconductor materials. Substrates may include, for example, not only conventional substrates but also other bulk semiconductor substrates such as, by way of non-limiting example, SOI type substrates, silicon-on-sapphire (SOS) type substrates, and epitaxial layers of silicon supported by another material. Furthermore, when reference is made to a "substrate" in the following description, previous process steps may have been utilized to at least partially form elements or components of a circuit or device in or over a surface of the wafer. By way of example and not limitation, the substrate 104 may include polysilicon that is doped with a p-type dopant, such as boron or aluminum, i.e., p-type polysilicon.

Each of the transistors 102 of the semiconductor structures 100A, 100B may include a body 110 of a semiconductor material, a gate dielectric 114 and a storage material 116, and may be associated with a blocking material 118 and a control gate 120. The transistors 102 may be aligned with one another in a first direction x and the bodies 110 of each of the transistors 102 may extend in a second direction y substantially perpendicular to the first direction x. The transistors 102 may each be positioned between a first insulative material 106 and a second insulative material 107. As used herein, the term "insulative material" means and includes a material that acts as an electrical insulator, and which may also be characterized as a dielectric material. At least a portion of each of the transistors 102 may be isolated from the underlying silicon substrate 104 by the first and second insulative materials 106, 107, which may surround the transistors 102.

The first insulative material 106 may comprise an oxide material, e.g., silicon dioxide. As will be described in further detail, the first insulative material 106 may substantially fill a plurality of first trenches 150 in the substrate 104. Each of the first trenches 150 and, thus, the insulative material 106, may have an average width w1 of approximately one feature length (1 F). As used herein, the phrase "feature length" means and includes the size of the smallest feature formed in or on a semiconductor structure through photolithography or another technique. By way of example, current (at the time of this disclosure) typical feature lengths being used in memory arrays in the industry are between about 20 nm and about 100 nm, although this disclosure is not so limited.

The second insulative material 107 may be positioned within the silicon substrate 104 between adjacent first insulative materials 106. The second insulative material 107 may at least partially fill a second plurality of trenches 170 in the substrate 104, each of which includes an undercut region 170a. As used herein, the term "undercut region" means and includes a region in which material has been removed lateral to a surface of the semiconductor structure 100A, 100B (i.e., in a direction perpendicular to a direction in which the trenches 170 extend through the substrate 104) to form an open volume that extends under an overlying portion of the substrate 104. The undercut region 170a may have a greater width w2 than a portion of the trench 170 overlying the undercut region 170a. By way of example, the undercut region 170a may have a width w2 of about three feature lengths (3 F) and the portions of the trenches 170 overlying the undercut regions 170a may have a width w3 of about 1 F. The undercut regions 170a may extend between and contact adjacent first insulative materials 106, as is shown in FIGS. 1A and 1B. The second insulative material 107 in the undercut region 170a may optionally comprise one or more voids 109 therein, which may be filled with a gaseous material, such as air, oxygen gas, or nitrogen gas.

The first and second insulative materials 106, 107 may each include the same insulative material, e.g., an oxide, or different insulative materials. Therefore, there may not be a distinct or even discernable boundary therebetween as is shown in FIGS. 1A and 1B for the purposes of illustration.

Referring to FIG. 1A, the bodies 110 may each include doped regions 111 that are oppositely doped with respect to surrounding regions of the substrate 104. As used herein, the term "oppositely doped" means that one of the doped regions 111 and the substrate 104 includes a surplus of positive charge carriers (p-type), while the other includes a surplus of negative charge carriers (n-type). In embodiments in which the doped regions 111 comprise an n-type silicon and a region of the substrate 104 between the doped regions 111 comprises a p-type silicon, the cell transistors 102 may be referred to herein as "NPN transistors." In embodiments in which the doped regions 111 comprise p-type silicon and the region of the substrate 104 between the doped regions 111 comprises n-type silicon, the transistors 102 may be referred to herein as "PNP transistors." While the doped regions 111 are not shown in the semiconductor structure 100B of FIG. 1B, it will be understood that such doped regions 111 may be similarly formed in portions of the bodies 110 between storage material 116.

The gate dielectric 114 may be disposed over each of the bodies 110 and the storage material 116 may be disposed over portions of the gate dielectric 114. For the purposes of illustration, portions of the control gate 120 and the blocking material 118 shown in broken lines in FIGS. 1A and 1B have been removed to show the positioning of the gate dielectric 114 and storage material 116 underlying these structures. However, in actuality and as configured, the control gate 120 and the blocking material 118 extend over each portion of the storage material 116.

The gate dielectric 114 may include, for example, a gate oxide, e.g., gallium oxide, silicon dioxide, aluminum oxide, hafnium dioxide, magnesium oxide, tantalum oxide, or another gate material, e.g., aluminum nitride or silicon nitride. The storage material 116 may include, for example, a conductive material, e.g., polysilicon or a metal, or a so-called "charge-trapping material," e.g., silicon nitride, tantalum silicon oxide, strontium silicon titanate or hafnium silicon oxide, and may be disposed over portions of the gate dielectric 114 laterally adjacent the doped regions 111. The storage material 116 may be positioned between the blocking material 118 and the gate dielectric 114 such that surfaces of the gate dielectric 114 are exposed through the control gates 120. As would be understood by one of ordinary skill in the art, the storage material 116 may be selected depending on the type of memory device being formed from the semiconductor structure 100A, 100B. The storage material 116 may store an electrical charge, which may be a unit of data, as is known in the art.

The blocking material 118 may be disposed over the storage material 116. The blocking material 118 may include a dielectric material, such as, a high-k dielectric material, e.g., hafnium silicate, zirconium silicate, hafnium dioxide and zirconium dioxide, or an oxide/nitride/oxide (ONO) dielectric material.

At least one control gate 120 may be disposed over the blocking material 118. The control gate 120 may include a conductive material, such as, a metal or a polysilicon. The control gate 120 may be used to supply an electrical voltage to the transistors 102 for reading and writing operations. The blocking material 118 may be used to block the migration of electrical charge from the storage material 116 to the control gate 120, thus preserving the bit of information in the transistor, as is known in the art. Thus, a non-volatile transistor, i.e., a transistor that maintains an electrical charge over time, may be formed.

Optionally, a plurality of conventional shallow trench isolation (STI) structures 160 may be formed in one or more peripheral regions of the semiconductor structures 100A and 100B. The STI structures 160 may include, for example, a plurality of trenches in the substrate 104, each of which is filled with a dielectric material, such as, silicon dioxide.

As shown in FIG. 1A, the bodies 110 may be connected to an underlying portion of the substrate 104 by a continuous region 128 of the substrate 104. For example, the continuous region 128 of the substrate 104 may be positioned at a peripheral region of the semiconductor structure 100A. The continuous region 128, or a portion thereof, may be doped to form a common p well. The connection between the bodies 110 and the underlying portion of the substrate 104 at the continuous region 128 of the substrate 104 may be used to enable global erase operations performed by substantially simultaneously applying a high voltage, e.g., 20 volts, to a p well, such as that formed in the continuous region 128. The semiconductor structure 100A may additionally include a gate line 132 and a common source line 134 in at least one peripheral region thereof. The gate line 132 may include a conductive material and may be disposed over the blocking material 118 overlying a portion of the storage material 116 positioned between the doped regions 111 in the bodies 110. The common source line 134 may also include a conductive material disposed on gate dielectric 114 overlying at least one of the doped regions 111.

Referring to FIGS. 1A and 1B, while the semiconductor structures 100A and 100B are illustrated as including six transistors 102, in actuality and as configured, the semiconductor structures 100A and 100B may include any number of transistors 102.

By way of example and not limitation, the arrays of transistors 102 of the semiconductor structures 100A and 100B may be used to form one or more NVM devices, such as a NAND memory device.

Embodiments of methods for forming the semiconductor structures 100A and 100B shown in FIGS. 1A and 1B are described in detail with reference to FIGS. 4 through 14.

Figure 2A:
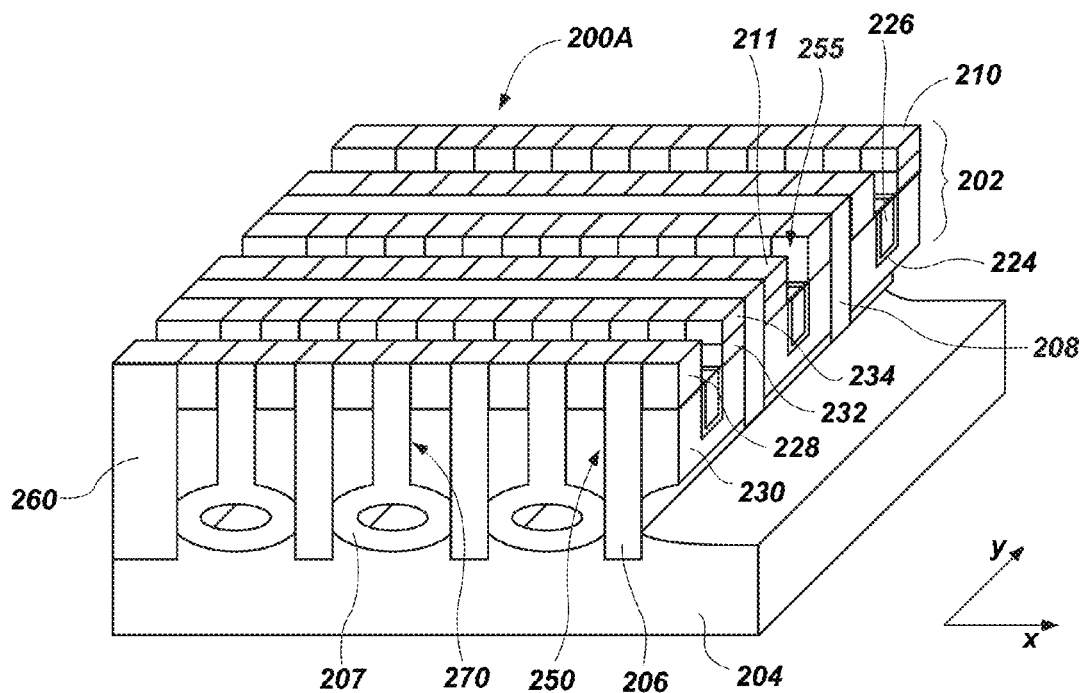
Figure 2B:
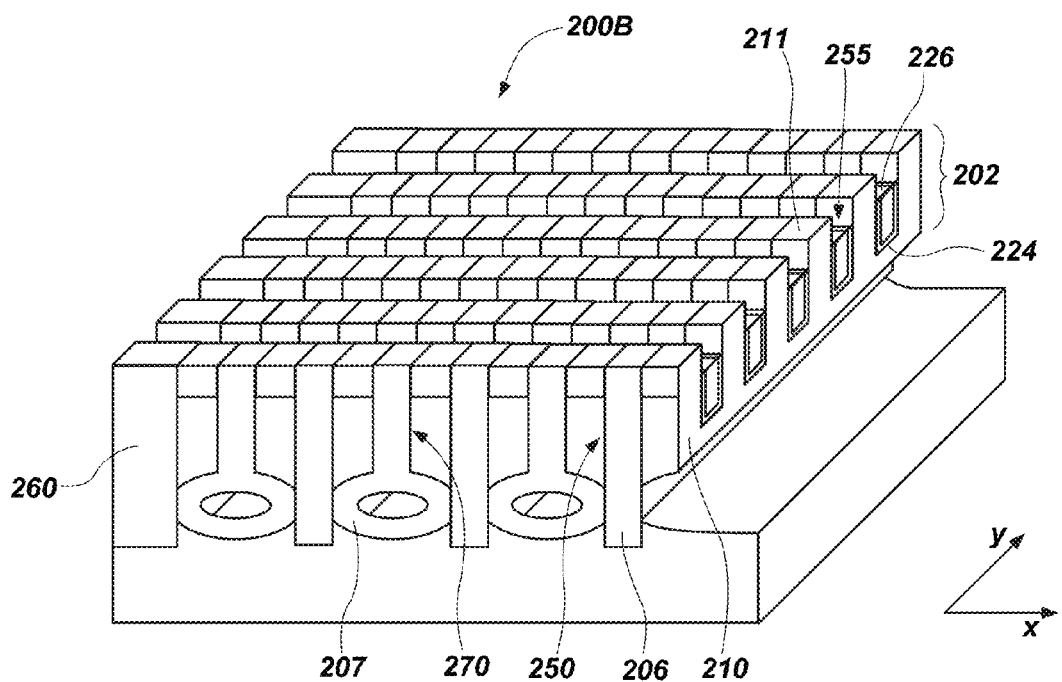

FIGS. 2A and 2B each show an embodiment of a portion of a semiconductor structure 200A, 200B of the present disclosure. By way of example, the semiconductor structures 200A, 200B may each include a plurality of transistors 202 overlying a substrate 204, each of the transistors 202 including a body 210 of a semiconductor material, a gate dielectric 224 and a gate 226.

In the semiconductor structure 200A shown in FIG. 2A, the transistors 202 may be aligned with one another in the first direction x and in a second direction y substantially perpendicular to the first direction x. Each of the transistors 202 aligned in the first direction x may be spaced apart from adjacent transistors 202 by first, second and third insulative materials 206, 207, 208. The first and second insulative materials 206, 207 may, respectively, fill first and second trenches 250, 270 similar to the first and second insulative materials 106, 107 described with respect to FIGS. 1A and 1B. Each of the transistors 202 aligned in the second direction y may be spaced apart from adjacent transistors 202 by third insulative material 208. The third insulative material 208 may include, for example, an oxide material, e.g., silicon dioxide, or a nitride material, e.g., silicon nitride.

In the semiconductor structure 200B shown in FIG. 2B, the transistors 202 may be aligned with one another in the first direction x, which may be substantially perpendicular to the second direction y in which the bodies 210 of the transistors 202 extend. The transistors 202 aligned in the first direction x may be spaced from adjacent transistors 202 by the first and second insulative materials 206, 207. Each of the bodies 210 may include pillars 211 on opposite sides of channels 255.

Referring to FIG. 2A, the bodies 210 may include a plurality of alternately doped regions, such as a first n+ region 228, a first p base region 230, a second n base region 232, and a second p+ region 234. As used herein, the terms "alternately doped regions" and "alternately doped semiconductor regions" mean and include portions of oppositely doped semiconductor material disposed in succession, one after the other. For example, the first and second n+ regions 228, 232 may include an n-type silicon material and the first and second p base regions 230, 234 may comprise a p-type silicon material.

The first n+ regions 228 may be electrically connected to a cathode line (not shown). The second p+ regions 234 may be electrically connected to an anode line (not shown). A gate dielectric 224 may be disposed over sidewalls exposed within the channels 255 such that it is positioned in contact with the first p base region 230 of each of the bodies 210 aligned in a first direction x. A conductive gate 226 may be disposed over the gate dielectric 224, at least partially filling the channels 255 in each of the bodies 210 aligned in the first direction x. The gate dielectric 224 and buried conductive gate 226 may provide electrical access to the first p base region 230 of each associated transistor 202 to activate the those transistors 202. Such transistors 202 may be referred to as so-called "thyristors."

Optionally, a plurality of conventional shallow trench isolation (STI) structures 260 may be formed in one or more peripheral regions of the semiconductor structures 200A and 200B. The STI structures 260 may include, for example, a plurality of trenches in a substrate 204, each of which is filled with a dielectric material, such as, silicon dioxide.

The semiconductor structure 200A shown in FIG. 2A is illustrated as including seven (7) transistors 102 aligned in the first direction x and three transistors 102 aligned in the second direction y and the semiconductor structure 200B shown in FIG. 2B is illustrated as including seven (7) transistors 102 aligned in the first direction x. However, in actuality and as configured, the semiconductor structures 200A and 200B may include any number of transistors 102.

By way of example and not limitation, the semiconductor structures 200A and 200B may be used to form one or more semiconductor devices.

Embodiments of methods for forming the semiconductor structures 200A and 200B shown in FIGS. 2A and 2B are described in detail with reference to FIGS. 15 and 16.

Figure 3:
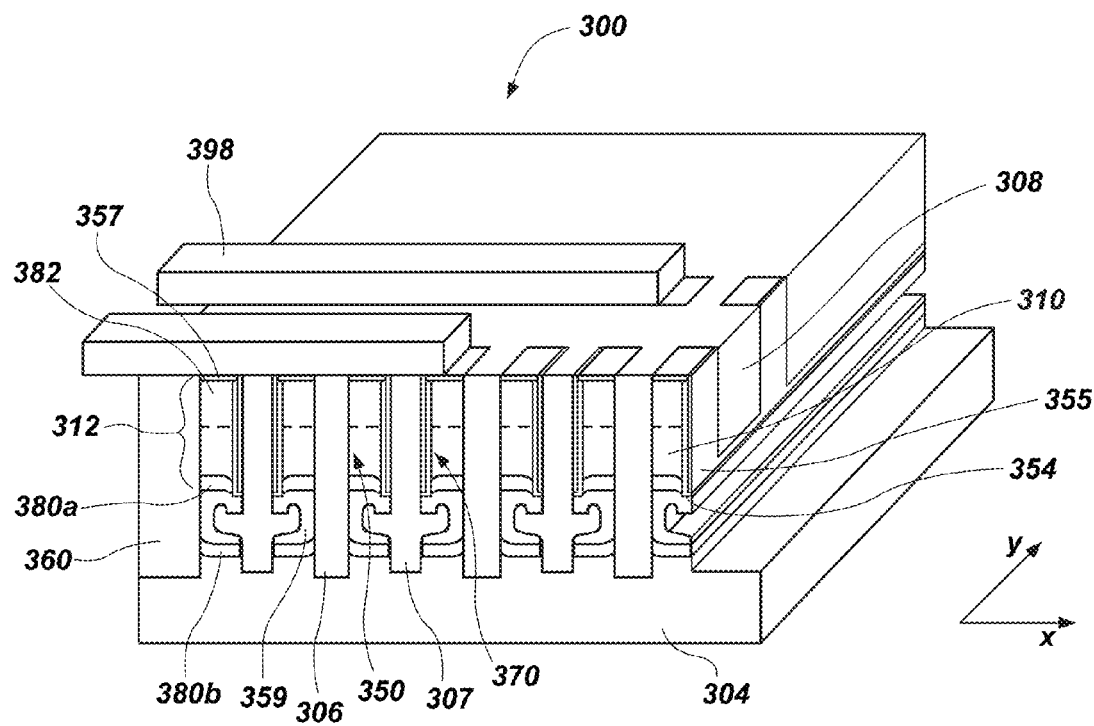

Another embodiment of a semiconductor structure 300 is shown in FIG. 3. Such a semiconductor structure 300 includes a plurality of diodes 312, each including a body of a semiconductor material including a portion 380a of a first doped region and second doped region 382 therein, and a storage material 357 disposed over the second doped region 382.

Each of the diodes 312 may be associated with a first conductive line 359 and a second conductive line 398. The diodes 312 may be aligned with one another in a first direction x and a second direction y, which may be substantially perpendicular to the first direction x. The semiconductor structure 300 shown in FIG. 3 includes seven diodes 312 aligned in the first direction x and four diodes 312 aligned in the second direction y. However, in actuality and as configured, the semiconductor structure 300 may include any number of diodes 312.

Each of the diodes 312 aligned in the first direction x may be spaced apart from adjacent diodes 312 by first and second insulative materials 306, 307 and by first and second liners 354, 355. The first and second insulative materials 306, 307 may, respectively, fill first and second trenches 350, 370 similar to the first and second insulative materials 106, 107 described with respect to FIGS. 1A and 1B. Each of the diodes 312 aligned in the second direction y may be spaced apart from adjacent diodes 312 by a third insulative material 308.

The first conductive lines 359 may be positioned between portions 380a, 380b of a doped region and may extend over a plurality of the diodes 312 aligned in the direction y. The first conductive lines 359 may include, for example, a metal material or a polysilicon material. The first conductive lines 359 may function as an access line, e.g., a so-called "word line," in the semiconductor structure 300. The first conductive lines 359 may be referred to as so-called "buried" conductive lines 359 since they are positioned below other features, e.g., the diodes 312, in the semiconductor structure 300, as will be discussed in further detail. FIG. 3 depicts the first conductive lines 359 as having a c-shaped profile; however, in actuality and as configured, the first conductive lines 359 may have various other profiles may also be formed, as will be recognized by one of ordinary skill in the art.

The second conductive lines 398 may be disposed on the storage material 357 overlying the plurality of diodes 312 aligned in the first direction x. The conductive line 398 may function as a bit line in semiconductor structure 300.

The semiconductor structure 300 may be used, for example, to form two-terminal multi-level semiconductor device including a plurality of vertically stacked semiconductor devices, such as, a vertical cross-point memory device.

Embodiments of methods for forming the semiconductor structure 300 shown in FIG. 3 will be described in detail with reference to FIGS. 17 through 24.

Figure 4:
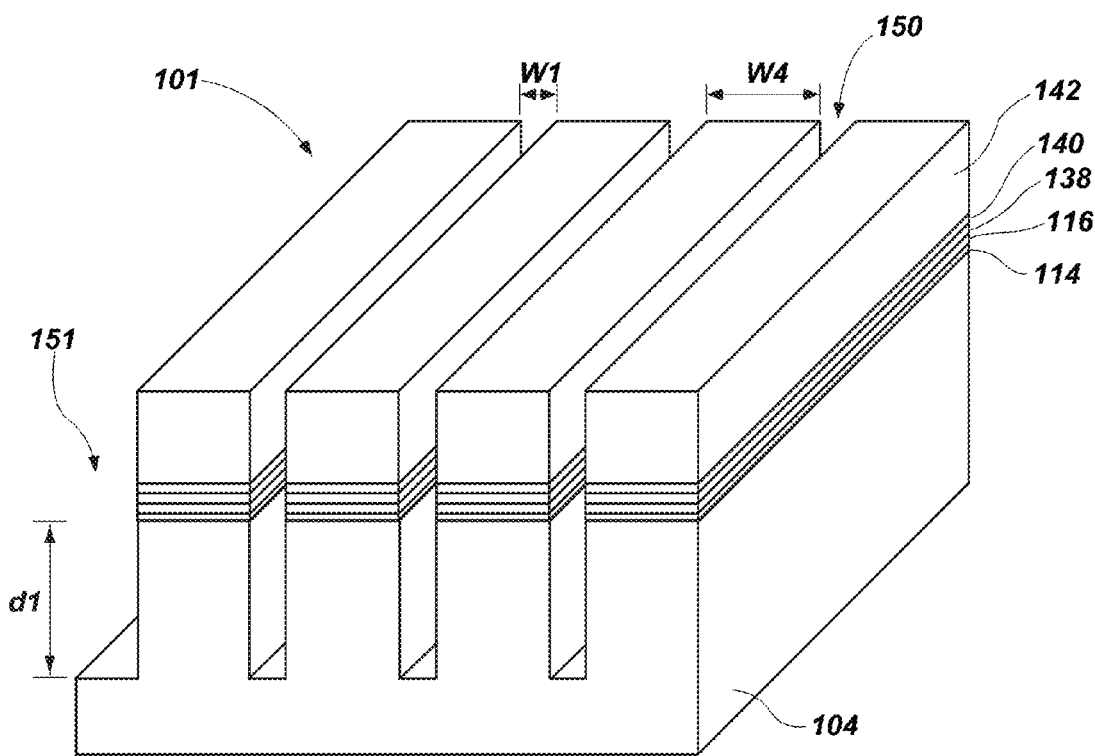
FIGS. 4 through 14 illustrate an embodiment of a method for forming the semiconductor structures shown in FIGS. 1A and 1B of the present disclosure.

Referring to FIGS. 4 through 14, a method of forming semiconductor structures 100A and 100B shown in FIGS. 1A and 1B will now be described, wherein like elements are designated by like numerals. As shown in FIG. 4, the plurality of first trenches 150 may be formed extending through the gate dielectric 114, the storage material 116, a barrier material 138, an etch stop material 140 and a sacrificial material 142 and into the substrate 104. Prior to forming the first trenches 150, each of the gate dielectric 114, the storage material 116, the barrier material 138, the etch stop material 140 and the sacrificial material 142 may be formed over the substrate 104. For example, the gate dielectric 114 may be formed from an oxide material, e.g., silicon dioxide, tetraethylorthosilicate (TEOS), aluminum nitride, gallium oxide, aluminum oxide, hafnium oxide, etc., using a conventional deposition process, such as a chemical vapor deposition (CVD) process, an atomic layer deposition (ALD) process or a physical vapor deposition (PVD) process. As another non-limiting example, the gate dielectric 114 may be formed by oxidizing a surface of the substrate 104 using techniques known in the art. In embodiments in which the substrate 104 is formed from a silicon material, the gate dielectric 114 comprising silicon dioxide may be formed by oxidizing an exposed surface of the silicon.

As previously discussed, the storage material 116 may be formed from at least one of a conductive material or charge-trapping material. By way of example and not limitation, the storage material 116 may be formed over the gate dielectric 114 using a conventional deposition process, such as a CVD process, an ALD process or a PVD process.

The barrier material 138 may be formed from a dielectric material, such as a nitride material, e.g., silicon nitride. The barrier material 138 may be formed over the storage material 116 using a conventional deposition process, such as a CVD process, an ALD process or a PVD process.

The etch stop material 140 may be formed from a material that exhibits resistance to an etchant that may be used to remove overlying materials. In embodiments in which the sacrificial material 142 is formed from polysilicon, the etch stop material 140 may be formed from a dielectric material, such as silicon nitride, which enables selective removal of the polysilicon overlying the silicon nitride. The etch stop material 140 may be formed over the barrier material 138 using a conventional deposition process, such as a CVD process, an ALD process or a PVD process.

The sacrificial material 142 may be formed from a polysilicon material or a dielectric material using a conventional deposition process, such as a CVD process, an ALD process or a PVD process. By way of example and not limitation, the sacrificial material 142 may be formed over the etch stop material 140 by PVD, followed by a conventional planarization process, e.g., a chemical mechanical planarization (CMP) process. For example, a thickness of the sacrificial material 142 may be from about 10 nm to about 50 nm.

The first trenches 150 may be formed by removing material from the sacrificial material 142, the etch stop material 140, the barrier material 138, the storage material 116, the gate dielectric 114 and the substrate 104 to a predetermined depth. For example, the first trenches 150 may be formed by depositing a mask material (not shown) over the sacrificial material 142 and patterning the mask material to form apertures through which surfaces of the sacrificial material 142 are exposed. The mask material may include, for example, a photoresist material, an oxide material, transparent carbon or amorphous carbon. Methods of forming and patterning the mask material are known in the art and, therefore, are not described in detail herein. Portions of the sacrificial material 142 exposed through the apertures in the mask material and underlying portions of the etch stop material 140, the barrier material 138, the storage material 116, the gate dielectric 114 and the substrate 104 may be removed to form the first trenches 150. The remaining portions of the mask material may then be removed.

By way of non-limiting example, the first trenches 150 may be formed extending in the second direction y through the etch stop material 140, the barrier material 138, the storage material 116, the gate dielectric 114 and a portion of the substrate 104. Semiconductor structure 101 shown in FIG. 4 includes three first trenches 150. However, in actuality and as configured, the semiconductor structure 101 may include any number of first trenches 150. The first trenches 150 may extend into the substrate 104 to a depth d1 of between about 40 nm and about 200 nm. A width w1 of the first trenches 150 may be, for example, about 1 F and a width w4 of material remaining between the first trenches 150 may be about 3 F. During formation of the first trenches 150, the materials in a peripheral region of the semiconductor structure 101 may be removed to form at least one STI trench 151, which will be used to form the STI structures 160 (FIGS. 1A and 1B), as will be described.

During formation of conventional STI structures, a material left between STI trenches conventionally has a width of 1 F. As feature sizes are reduced to form smaller semiconductor devices, material left between the STI trenches may be physically unstable, leading to buckling, toppling or other deformation of such material. As previously discussed, in the methods described herein, a width w3 of material remaining between the first trenches 150 is about 3 F, which substantially improves the physical stability of the semiconductor structure 101.

Figure 5:
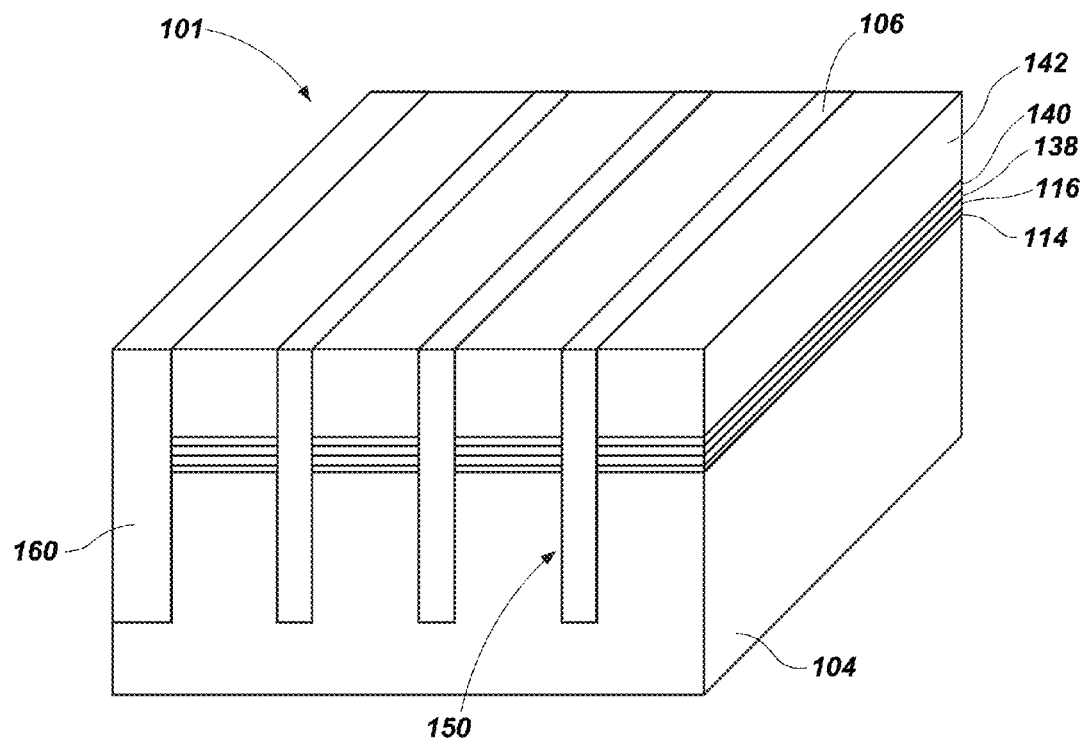

Referring to FIG. 5, the first trenches 150 may be filled with the first insulative material 106. By way of example and not limitation, the first insulative material 106 may be formed from a dielectric material, such as an oxide material or a nitride material using a conventional CVD process, or may be formed from a spin-on-dielectric (SOD) material. After forming the first insulative material 106, a conventional planarization process, e.g., a CMP process, may be used to remove portions of the first insulative material 106 overlying the sacrificial material 142. The STI trench(es) 151 may also be filled with the first insulative material 106 to form the STI structure(s) 160.

Figure 6:
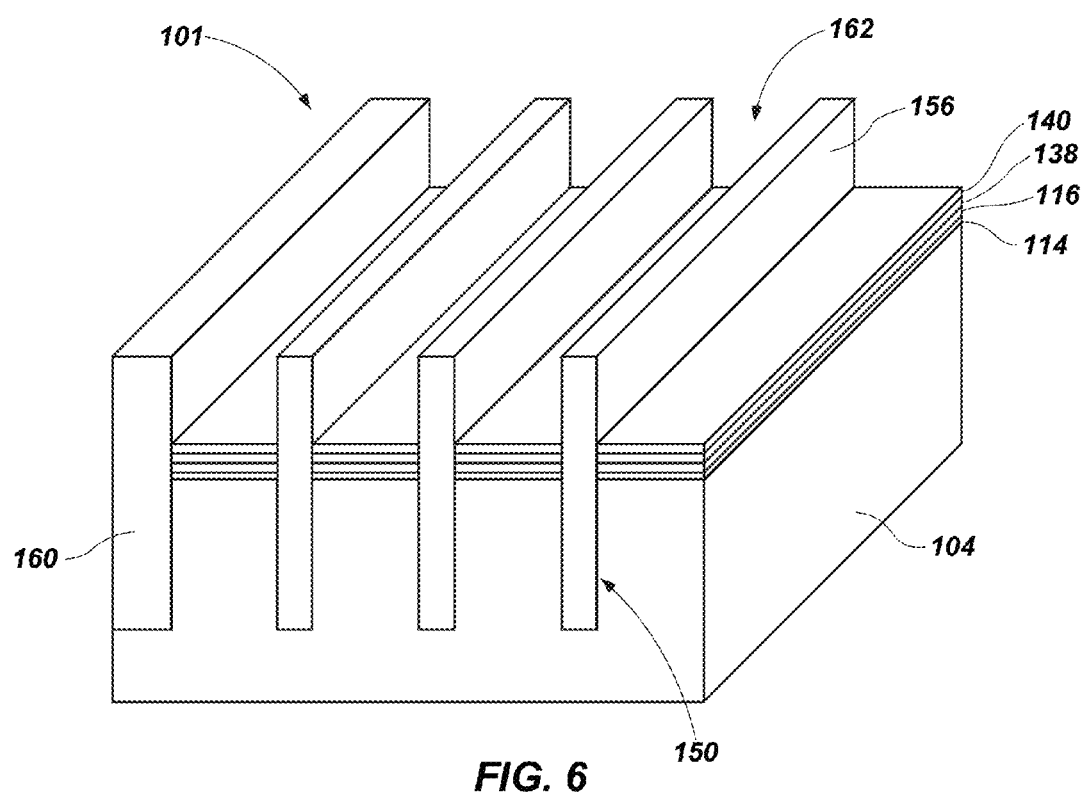

The remaining portions of the first insulative material 106 within the first trenches 150 may be referred to herein as "rails" 156 of first insulative material. As shown in FIG. 6, the sacrificial material 142 may be removed to form a plurality of openings 162 between exposed portions of the rails 156 of first insulative material. The openings 162 may be formed by removing the sacrificial material 142 with respect to the rails 156 of first insulative material and the etch stop material 140. For example, the sacrificial material 142 may be removed using a conventional wet etching process. In embodiments in which the sacrificial polysilicon material 142 is formed from a polysilicon material, the etch stop material 140 is formed from silicon nitride and the first insulative material of the rails 156 is formed from silicon dioxide, the polysilicon material may be exposed to tetramethylammonium hydroxide (TMAH) to remove the polysilicon without removing the silicon nitride or the silicon dioxide. The rails 156 of first insulative material may protrude from remaining portions of the first trenches 150 and may extend above the etch stop material 140.

Figure 7:
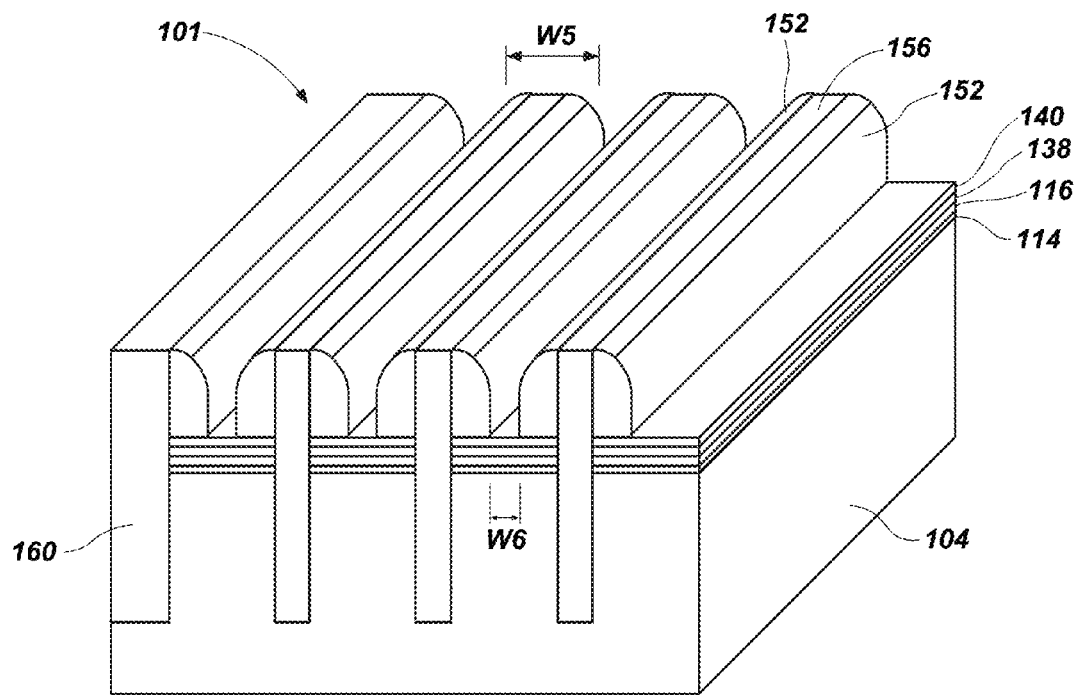

As shown in FIG. 7, spacers 152 may be formed on both sides of each rail 156 of first insulative material. The spacers 152 may be formed by forming a material (e.g., silicon dioxide, silicon nitride, etc.) over the rails 156 of first insulative material and exposed surfaces of the etch stop material 140 and removing a portion of the material using a conventional anisotropic etching process, also referred to as a so-called "spacer etching process," which is known in the art and is not described in detail herein. By way of example and not limitation, the spacers 152 may be formed from the same material as rails 156 of first insulative material. For example, both the spacers 152 and the rails 156 of first insulative material may be formed from a silicon oxide (e.g., silicon dioxide). A surface of each of the rails 156 of first insulative material and surfaces of the etch stop material 140 may be exposed between the spacers 152. Each one of the rails 156 and the spacers 152 adjacent the rail 156 may have a width w5 of about 3 F such that the exposed surfaces of the etch stop material 140 between adjacent spacers 152 has a width w6 of about 1 F.

Figure 8:
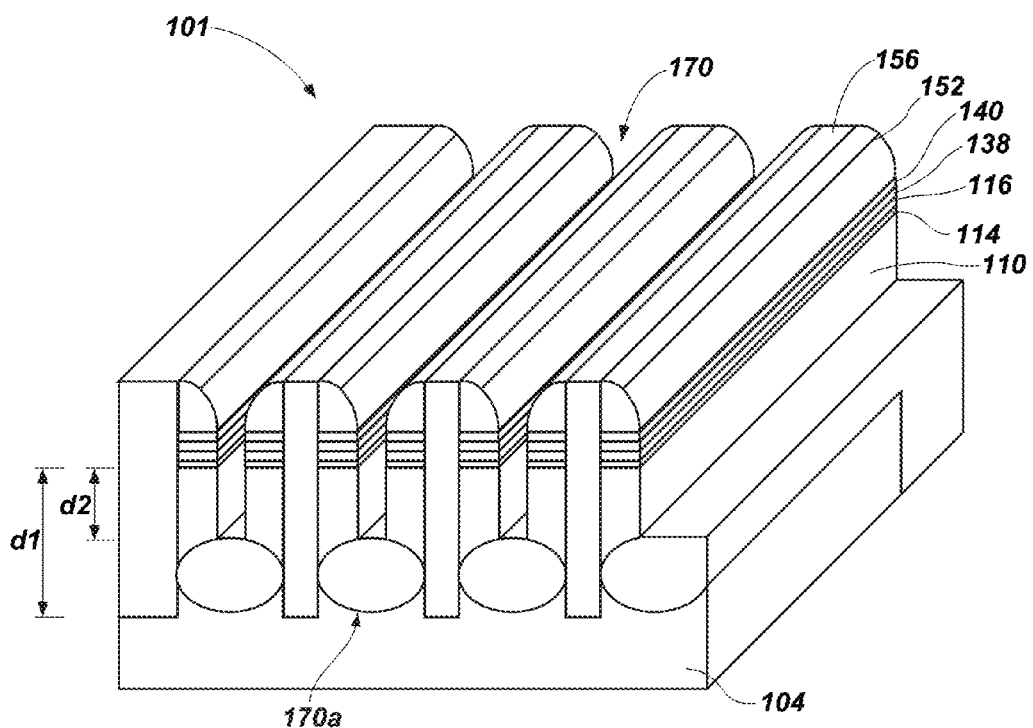

As illustrated in FIG. 8, the plurality of second trenches 170 may be formed extending through the etch stop material 140, the barrier material 138, the storage material 116, the gate dielectric 114, and at least partially into the substrate 104 using a similar method as described with respect to FIG. 4. In some embodiments, the second trenches 170 may be formed during the anisotropic etching process used to form spacers 152 as described with respect to FIG. 7. The second trenches 170 may be formed extending in the direction y substantially parallel to the first trenches 150 (FIG. 4). The second trenches 170 may be formed extending into the substrate 104 to a depth d2, which may be substantially less than the depth d1 of the first trenches 150 (FIG. 4). By way of example and not limitation, the second trenches 170 may be formed extending into the substrate 104 a depth d2 of about 30 nm to about 80 nm.

Figure 9:
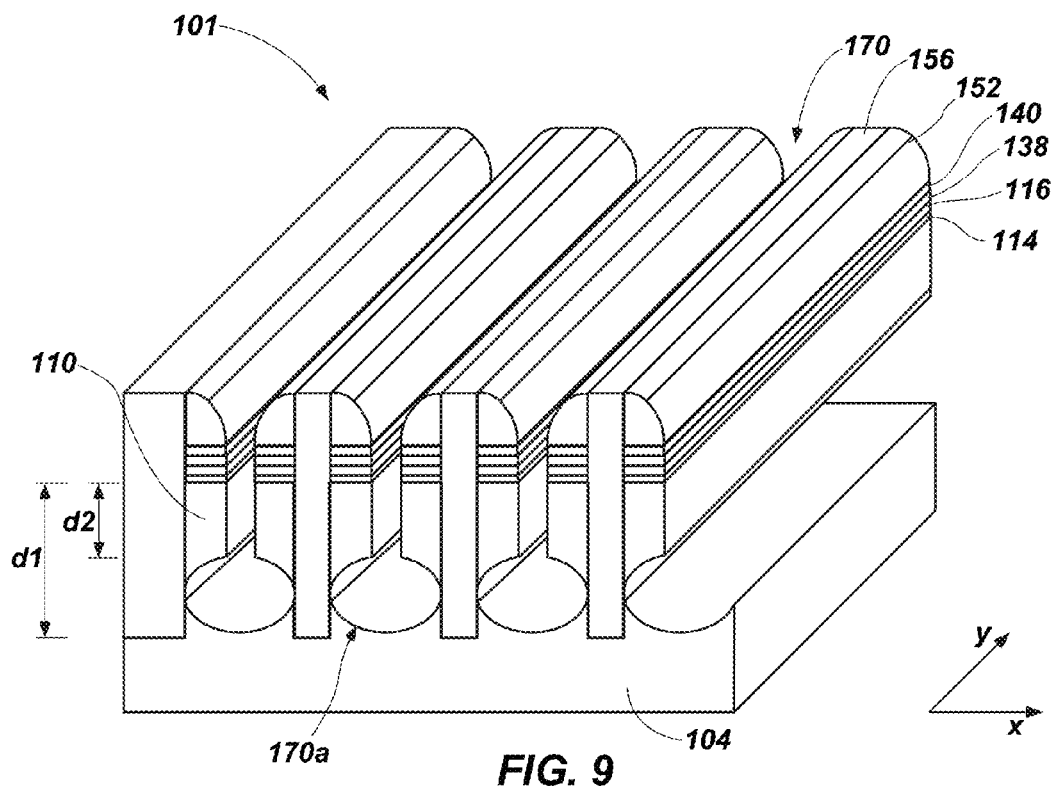

Referring to FIG. 9, after forming the second trenches 170, portions of the substrate 104 may be removed at terminal ends of the second trenches 170 to form undercut regions 170a that separate the bodies 110 from an underlying portion of the substrate 104. For example, to form the second trenches 170, a liner (not shown) may be formed over sidewalls within the second trenches 170 and the portions of the substrate 104 may be removed from surfaces thereof exposed through the liner. The liner may be formed from any material that may be selectively etched with respect to the material of the substrate 104, such as, a polymer material or a dielectric material. For example, the liner may be formed over surfaces within the second trenches 170 using a conventional deposition process, and a portion thereof may be removed to expose surfaces of the substrate 104 at the terminal ends of the second trenches 170. The liner may have a thickness of between about 1.5 nm to about 30 nm. The liner may function to protect the silicon sidewalls of the second trenches 170 during removal of portions of the substrate 104 to form the undercut regions 170a.

After removing the portions of the liner to expose a surface of the substrate 104 at the bottom of each of the second trenches 170, material may be removed from the substrate 104 to form the undercut regions 170a at the terminal ends of the trenches 170, which undercut regions 170a separate the bodies 110 from the remaining portion of the substrate 104. For example, to form the undercut regions 170a, the substrate 104 may be exposed to an etchant that selectively removes material from the substrate 104 with respect to the liner and the rails of the first dielectric material. For example, the undercut regions 170a may be formed by removing material laterally, meaning in a direction substantially parallel to a surface of the substrate 104 to form an open volume, e.g., the undercut region 170a, that extends under an overlying portion of the substrate 104. Such a process is often referred to as a so-called "undercutting" process. Material may be laterally removed from the substrate 104 in the first direction x, i.e., the direction substantially perpendicular to the second direction y in which the first and second trenches 150 and 170 extend through the substrate 104, to expose surfaces of the rails 156 of the first insulative material on opposite sides of the undercut regions 170a. As the undercut regions 170a are formed, the bodies 110 are separated from the remaining portion of the substrate 104. Pairs of the bodies 110 may be held in place by the rails 156 of the first insulative material therebetween. Laterally removing portions of the substrate 104 to form the undercut regions 170a may result in bodies 110 that are substantially physically isolated from the underlying silicon substrate 104. As shown in FIG. 8, the second trenches 170 and the undercut regions 170a at the terminal ends thereof may be formed to extend along an entire length of the substrate 104 in the direction x. However, as configured, the second trenches 170 and the undercut regions 170a may optionally be formed to extend only partially along a length of the substrate 104 such that the substrate 104 and the bodies 110 remain connected by the continuous region 128, as shown in FIG. 1A. The bodies 110 may be physically and electrically connected to the underlying silicon substrate 104 by the continuous region 128 of the substrate 104. In embodiments in which the continuous region 128 connects the bodies 110 and the substrate 104, the peripheral region of the semiconductor structure 101 may be masked prior to performing the processing acts described with respect to FIGS. 4 through 9.

In some embodiments, the acts described with respect to FIGS. 8 and 9 may be performed substantially simultaneously using an etching process such as that described in U.S. Patent Application Publication No. 2006/0292787 to Wang et al., published Dec. 28, 2006. Referring to FIG. 8, as material is removed from the substrate 104 to form the second trenches 170 using an isotropic etching processes, the liner may be formed in situ by exposing surfaces of the substrate 104 within the second trenches 170 to at least one of an oxygen plasma and source gas for forming an organic polymer material, e.g., trifluoromethane, difluoromethane, methane, ethane, ethylene, ammonia and hydrogen bromide.

As shown in FIG. 9, the second trenches 170 including the undercut regions 170a at the terminal ends thereof may extend into the substrate 104 to substantially the same depth (d1) as the first trenches 150, or may be shallower than the first trenches 150.

FIGS. 8 and 9 illustrate an example of forming the bodies 110 by laterally removing portions of the substrate 104 to form the undercut regions 170a at terminal ends of the trenches 170. However, in actuality and as configured, the bodies 110 may be separated from the substrate 104 using various methods, as would be recognized by one of ordinary skill in the art. FIGS. 10 through 13 illustrate additional embodiments of methods for separating the bodies 110 from the substrate 104 by removing portions of the substrate 104 underlying the bodies 110.

Figure 10:
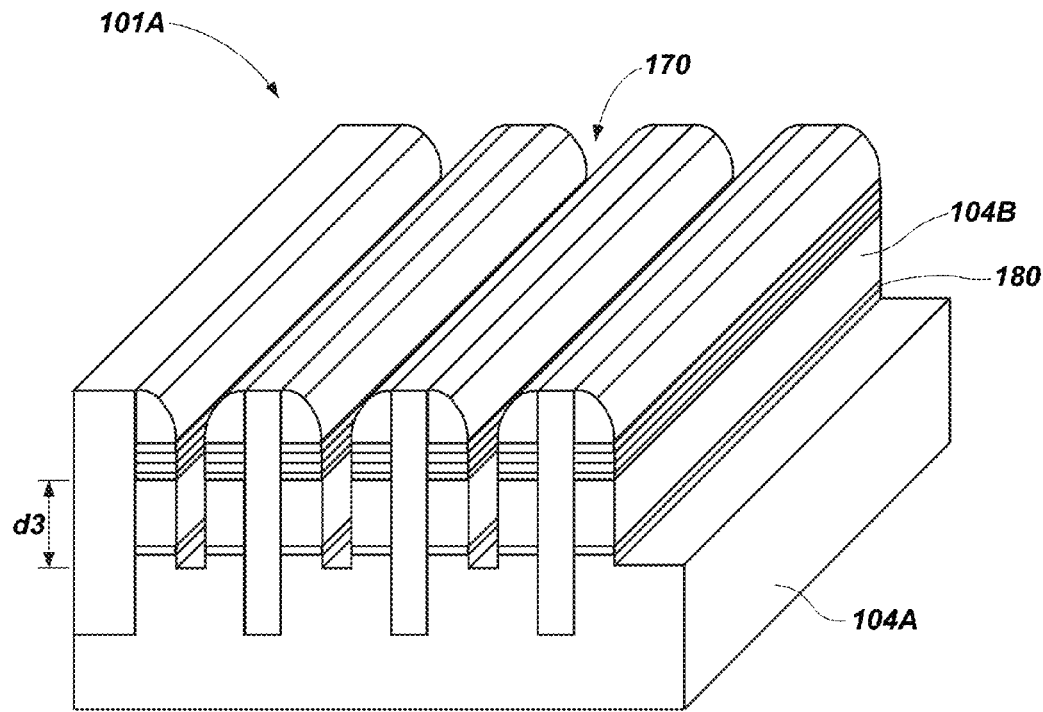
Figure 11:
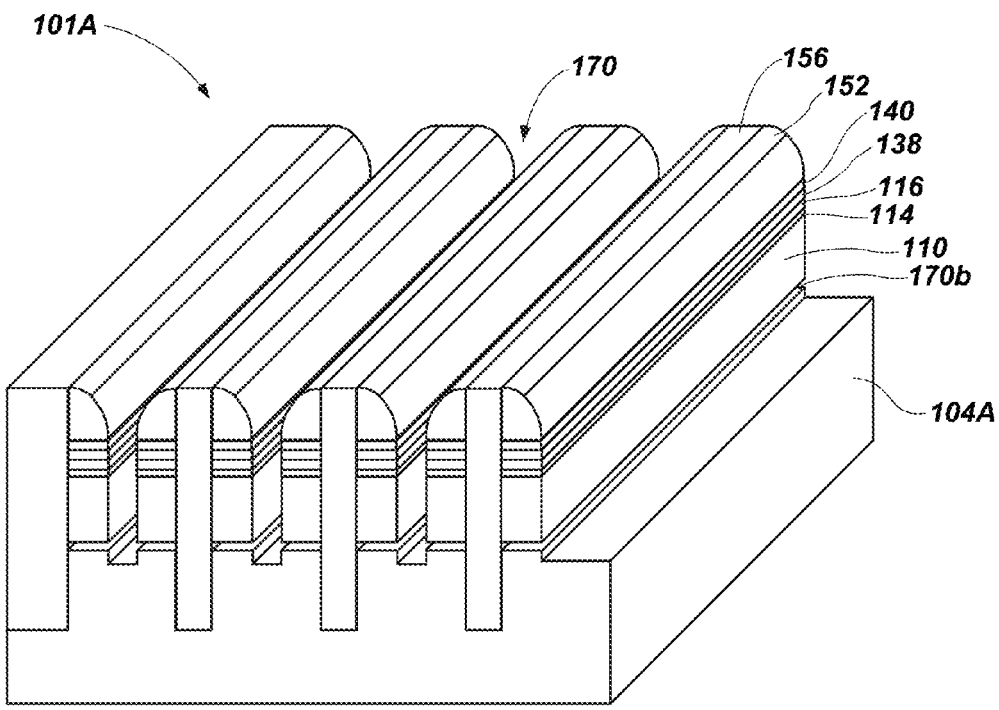

For example, as shown in FIGS. 10 and 11, a semiconductor structure 101A is shown that may be formed using a similar method as described with respect to FIGS. 4 through 8. The second trenches 170 may be formed through the etch stop material 140, the barrier material 138, the storage material 116, the gate dielectric 114 and a second portion of the substrate 104B, and into a first portion of the substrate 104A using a similar method as described with respect to FIG. 8. The trenches 170 may additionally extend through a sacrificial material 180 embedded between the first and second portions of the substrate 104A, 104B. The sacrificial material 180 may be formed from a material that may be selectively removed with respect to the first and second portions of the substrate 104A, 104B, the etch stop material 140, the barrier material 138, the storage material 116, the gate dielectric 114. By way of example and not limitation, the sacrificial material 180 may be formed from epitaxially grown silicon germanium. The sacrificial material 180 have a thickness between about 10 nm and about 30 nm, for example. The sacrificial material 180 may be embedded in between the first and second portions of the substrate 104A, 104B using conventional techniques. For example, in embodiments in which the sacrificial material 180 is formed from silicon germanium, the silicon germanium may be epitaxially grown over the first portion of the substrate 104A, e.g., a bulk silicon substrate, and, thereafter, the second portion of the substrate 104B may be formed over the silicon germanium. The second portion of the substrate 104B may be formed having a thickness of between about 30 nm and about 80 nm and may be formed over the silicon germanium from single crystal silicon using, for example, an epitaxial growth process.

After the semiconductor structure 101A is formed having the embedded sacrificial material 180 therein, the first trenches 150 are filled with the first dielectric material to form the rails 156, the spacers 152 and the second plurality of trenches 170 may be formed using a method similar to that described with respect to FIGS. 4 through 8. The second trenches 170 may be formed having a depth d3 that is sufficient to expose surfaces of the sacrificial material 180. While the second trenches 170 are shown as extending past the sacrificial material 180 and into the first portion of the substrate 104A, the second trenches 170 may be formed terminating at a surface of the sacrificial material 180, or at a surface of the first portion of the substrate 104A adjacent a lowermost surface of the sacrificial material 180.

As shown in FIG. 11, after forming the second trenches 170 having exposed surfaces of the sacrificial material 180 therein, remaining portions of the sacrificial material 180 may be removed to physically separate the second portion of the substrate 104B (FIG. 10) from the first portion of the substrate 104A forming the bodies 110. By way of example and not limitation, a conventional wet etch that selectively removes the sacrificial material 180 while leaving the bodies 110 and the first portion of the substrate 104A may be performed to form gaps 170b between the bodies 110 and the first portions of the substrate 104A. The gaps 170b may each extend laterally between remaining portions of the substrate, i.e., the bodies 110 and the first portions of the substrate 104A, to expose surfaces of the rails 156 of the first insulative material 106 (FIG. 4), at least partially isolating the bodies 110 from the underlying first portions of the substrate 104A.

Figure 12:
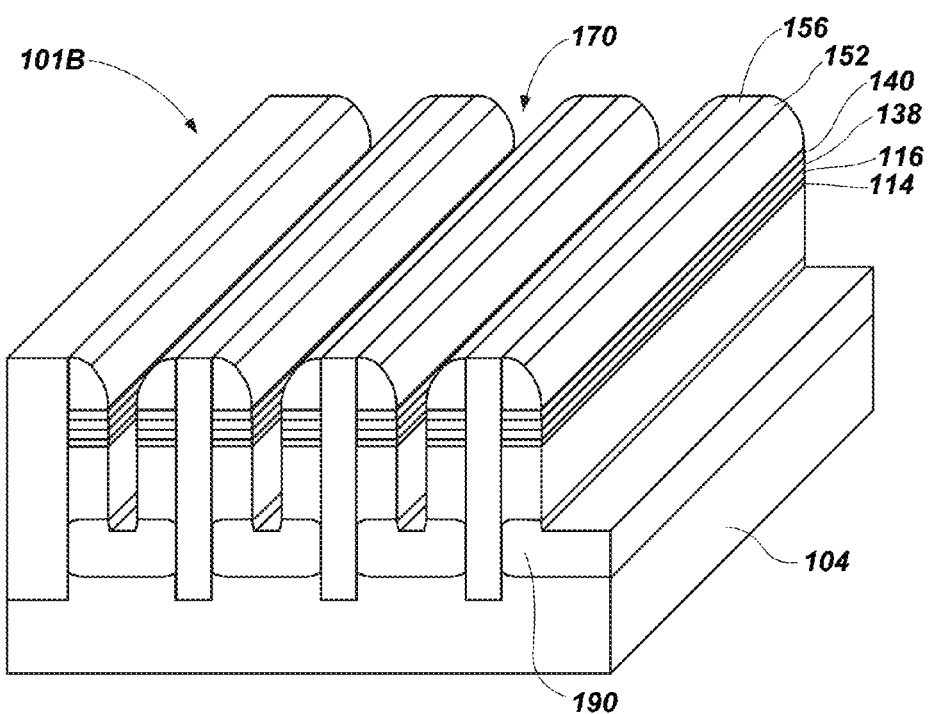
Figure 13:
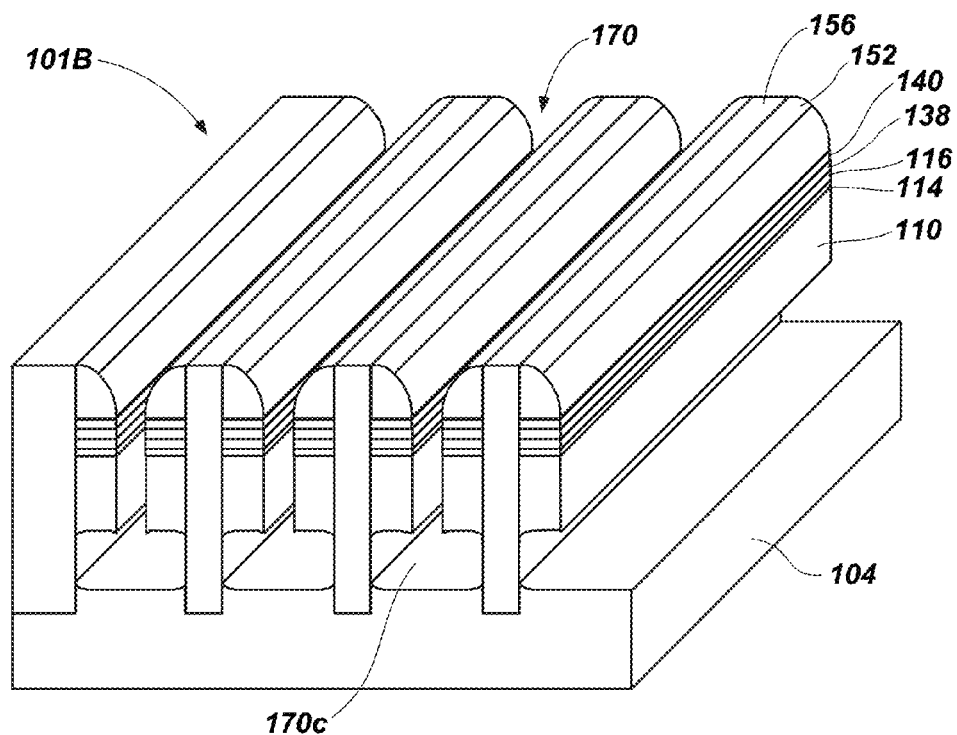

Referring to FIGS. 12 and 13, another example of a method of forming the bodies 110 of semiconductor structure 101B by removing portions of the substrate 104 underlying the bodies 110 is illustrated. A liner (not shown) may be formed over sidewalls within the second trenches 170 leaving surfaces of the substrate 104 at the terminal ends of the second trenches 170 exposed as described with respect to FIG. 8. The exposed surfaces of the substrate 104 at the terminal ends of the second trenches 170 (FIG. 8) may then be doped to form doped regions 190, as shown in FIG. 12. The doped regions 190 may extend from the terminal ends of the second trenches 170 to a desired depth within the substrate 104 and between adjacent rails 156 of first insulative material. By way of example, the doped regions 190 may be doped with a different impurity than the substrate 104 to enable selective removal of the doped regions 190 with respect to surrounding portions of the substrate 104. In embodiments in which the substrate 104 is formed from p-type silicon, surfaces of the substrate 104 exposed by the liner may be doped with an n-type dopant, e.g., phosphorous or arsenic, using a conventional method, such as an ion implantation process or a high temperature diffusion process, to form doped regions 190 comprising an n-type silicon material. For example, an ion implantation process may be performed to implant the dopants in to portions of the substrate 104 exposed within the second trenches 170 and, thereafter, an annealing process may be performed to laterally diffuse the dopants into the doped regions 190 extending between adjacent rails 156 of first insulative material. In embodiments in which the doped region 190 has a width of about 20 nm, the annealing process may be performed by exposing the semiconductor structure 101B to a temperature of about 950° C. for about one minute after implanting the dopants into the substrate 104 to laterally diffuse the dopants into the substrate 104 forming the doped regions 190.

Referring to FIG. 13, the doped regions 190 may be removed to form widened extensions 170c at terminal ends of the second trenches 170. The widened extensions 170c separate the bodies 110 from the remaining portions of the substrate 104. By way of example and not limitation, the widened extensions 170c of the second trenches 170 may be formed by removing the doped regions 190 using a conventional selective etching process. In embodiments in which the doped regions 190 are formed from n-type silicon and the substrate 104 is formed from p-type silicon, a wet etching process that selectively removes the n-type silicon with respect to the p-type silicon, the rails 156 of first insulative material and the liner may be performed to form the widened extensions 170c of the second trenches 170.

Figure 14:
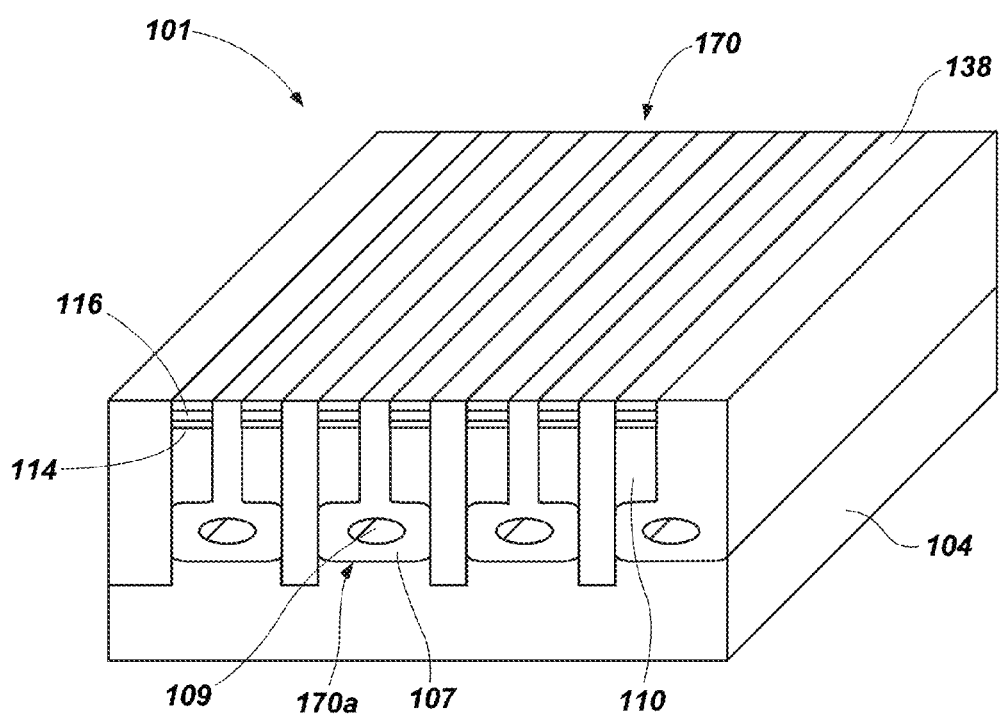

Referring to FIG. 14, the second trenches 170 may then be at least partially filled with the second insulative material 107, and the spacers 152, the etch stop material 140 and a portion of the second insulative material 107 overlying the barrier material 138 may be removed. For simplicity, the semiconductor structure 101 shown in FIG. 14 is illustrated as including the undercut regions 170a at the terminal ends of the second trenches 170. However, in actuality and as configured, the semiconductor structure 101 may alternatively include the gaps 170b (FIG. 11) or the widened extensions 170c (FIG. 13) at the terminal ends of the second trenches 170. By way of example and not limitation, the second insulative material 107 may be formed from a silicon oxide (e.g., silicon dioxide) using a conventional deposition process, such as a CVD process or a PVD process. Depending on the deposition process and an aspect ratio of the second trenches 170, the second insulative material 107 may only partially fill the undercut regions 170a resulting in voids 109 therein. The voids 109 may be filled with a gaseous material, e.g., one or more of air, nitrogen, and oxygen, such that the voids 109 may function as an electrical insulator.

For example, the second insulative material 107 may be formed over an entire surface of the semiconductor structure 101 and into the second trenches 170 and at least a portion of the undercut regions 170a. After forming the second insulative material 107, material overlying the barrier material 138 may be removed to expose surfaces of the barrier material 138. For example, the etch stop material 140, the spacers 152 and portions of the second insulative material 107 and the rails 156 extending above the barrier material 138 may be removed using a conventional polishing process, e.g., a CMP process. The barrier material 138 may act as a stopping material during removal of the overlying materials.

To form the semiconductor structures 100A and 100B shown in FIGS. 1A and 1B, the barrier material 138 may be removed, the storage material 116 may be patterned and the blocking material 118, the control gate(s) 120 and, optionally, the gate line 132 and the common source line 134 (FIG. 1A) may be formed over remaining portions of the storage material 116. The barrier material 138 and portions of the first and second insulative materials 106, 107 overlying the storage material 116 may be removed to expose surfaces of the storage material 116. Thereafter, portions of the storage material 116 may be removed to define the transistors 102. For example, the portions of the storage material 116 may be removed using conventional lithographic techniques to pattern the storage material 116 so that areas of the gate dielectric 114 are exposed therethrough.

The blocking material 118 may then be formed over surfaces of the remaining portions of the storage material 116 and over surfaces of the first and second insulative materials 106, 107 therebetween. The control gates 120 may be formed over the blocking material 118. For example, the blocking material 118 and the control gates 120 may be formed by depositing a dielectric material, e.g., a high-k dielectric material, and a conductive material over the entire surface of the semiconductor structure 101 (FIG. 14) and, thereafter, patterning and removing portions of each of the dielectric material and the conductive material to expose surfaces of the gate dielectric 114 between the remaining portions of the storage material 116. As another example, the blocking material 118 and the control gates 120 may be formed using a conventional damascene process. For example, a sacrificial dielectric material (not shown) may be deposited over the semiconductor structure 101 (FIG. 14) and a pattern of apertures may be formed therein in locations at which the blocking material 118 and the control gates 120 are to be formed using a conventional lithographic process. A dielectric material and a conductive material may be sequentially formed over the semiconductor structure 101 (FIG. 14) to fill the apertures and a chemical mechanical polishing process may be used to remove portions of the conductive material and the dielectric material overlying the sacrificial dielectric material to form the blocking material 118 and the control gates 120.

To form the semiconductor structure 100A shown in FIG. 1A, the gate line 132 and the common source line 134 may be formed in the peripheral region of the semiconductor structure 100A using a method similar to that described for forming the control gates 120. For example, the gate line 132 and the common source line 134 may be formed using conventional lithographic techniques or conventional damascene techniques.

Figure 15:
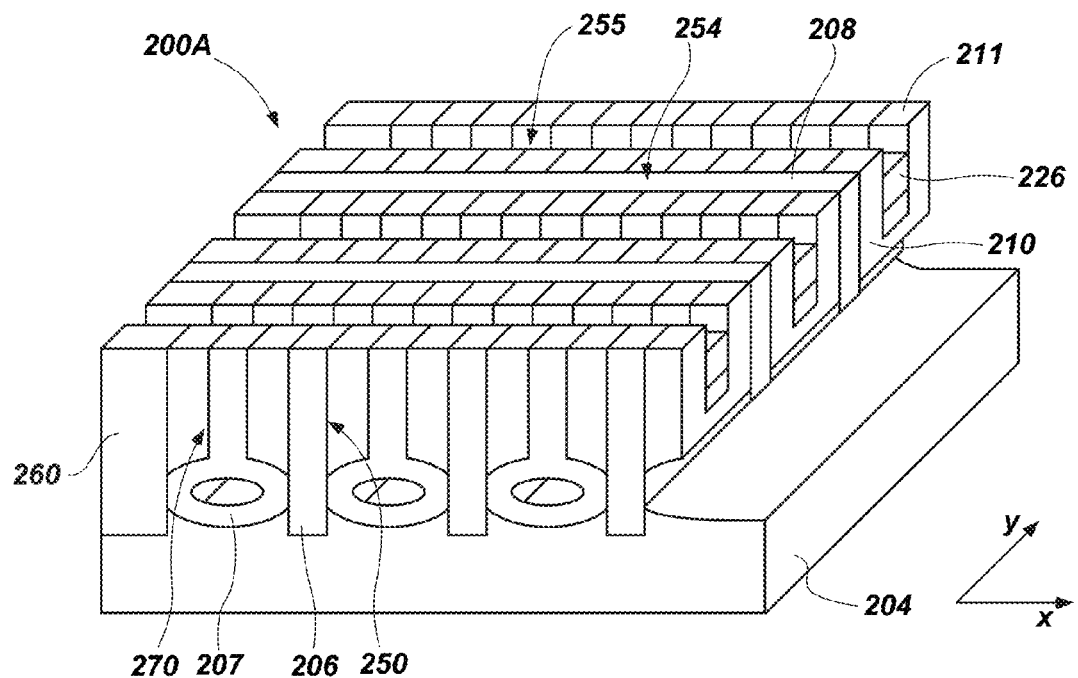
FIG. 15 illustrates an embodiment of a method for forming the semiconductor structure shown in FIG. 2A of the present disclosure.

With reference to FIG. 15, a method of forming the semiconductor structure 200A shown in FIG. 2A will now be described. First and second trenches 250, 270 may be formed in a substrate 204 and filled with first and second insulative materials 206, 207, and, optionally, STI structure(s) 260 may be formed, using a similar method as used to form the first and second trenches 150, 170 filled with the first and second insulative materials 106, 107, as described with reference to FIGS. 4 through 14. While FIGS. 4 through 14 describe forming the first and second trenches 250, 270 through the gate dielectric 114, the storage material 116, the barrier material 138, the etch stop material 140 and the sacrificial material 142, each of these materials may be omitted from the semiconductor structure 200A.

After forming the first and second trenches 250, 270, bodies 210 of the substrate 204 may be defined by forming first channels 254 and second channels 255 extending in the second direction y substantially perpendicular to the first and second trenches 250, 270, which extend in the first direction x. The first and second channels 254, 255 may be formed by removing portions of each of the substrate 204 and the first and second insulative materials 206, 207. The first channels 254 may be formed by forming a sacrificial dielectric material (not shown) over the semiconductor structure 200A, forming a pattern of apertures therein in locations at which the first channels 254 are to be formed using a conventional lithographic process. Material may then be removed from the substrate 204 and the first and second insulative materials 206, 207 to form the first channels 254. The first channels 254 may be filled with a third insulative material 208. The third insulative material 208 may be formed from a dielectric material (e.g., silicon oxide or silicon nitride).

The second channels 255 may be formed extending partially through each of the bodies 210 to form the pillars 211. For example, a sacrificial dielectric material (not shown) may be deposited over the semiconductor structure 200A and a pattern of apertures may be formed therein in locations at which the second channels 255 are to be formed using a conventional lithographic process. FIG. 15 depicts the second channels 255 forming a U-shaped profile within the bodies 210; however, channels having various other profiles may also be formed, as will be recognized by one of ordinary skill in the art.

To form the semiconductor structure 200A shown in FIG. 2A, each of the bodies 210 may be doped to form the alternately doped regions (i.e., the first and second n+ regions 228, 232 and the first and second p base regions 230, 234) and the gate dielectric 224 and the conductive gate 226 may be formed over surfaces exposed within the second channels 255, i.e., at least partially overlying sidewalls of the second channels 255 and a surface therebetween. The gate dielectric 224 may be formed from an oxide material, such as silicon dioxide, using a conventional deposition process, such as a CVD process, an ALD process or a PVD process. The conductive gate 226 may be formed over the gate dielectric 224, at least partially filling the first channels 254. The conductive gate 226 may be formed from a conductive material, such as, a metal or polysilicon, using a conventional deposition process.

The bodies 210 may be formed from p-type material or may be implanted with a dopant or impurity such that they substantially comprise a p-type material. The p-type material of the bodies 210 may form the first p base region 230, as will be described. Upper regions of the pillars 211 of each of the bodies 210 may be implanted with a dopant or impurity to form the first and second n+ regions 228, 232. The second p+ region 234 may then be formed in one of the pillars 211 of each of the bodies 210. By way of example and not limitation, the second p+ region 234 may be formed by forming a mask (not shown) over the semiconductor structure 200A that includes a plurality of apertures exposing surfaces of the pillars 211 of the bodies 210 in which the second p+ regions 234 will be formed. The exposed surfaces of the pillars 211 may then be implanted with a dopant or impurity to form the second p+ region 234 and, thereafter, the mask may be removed.

Figure 16:
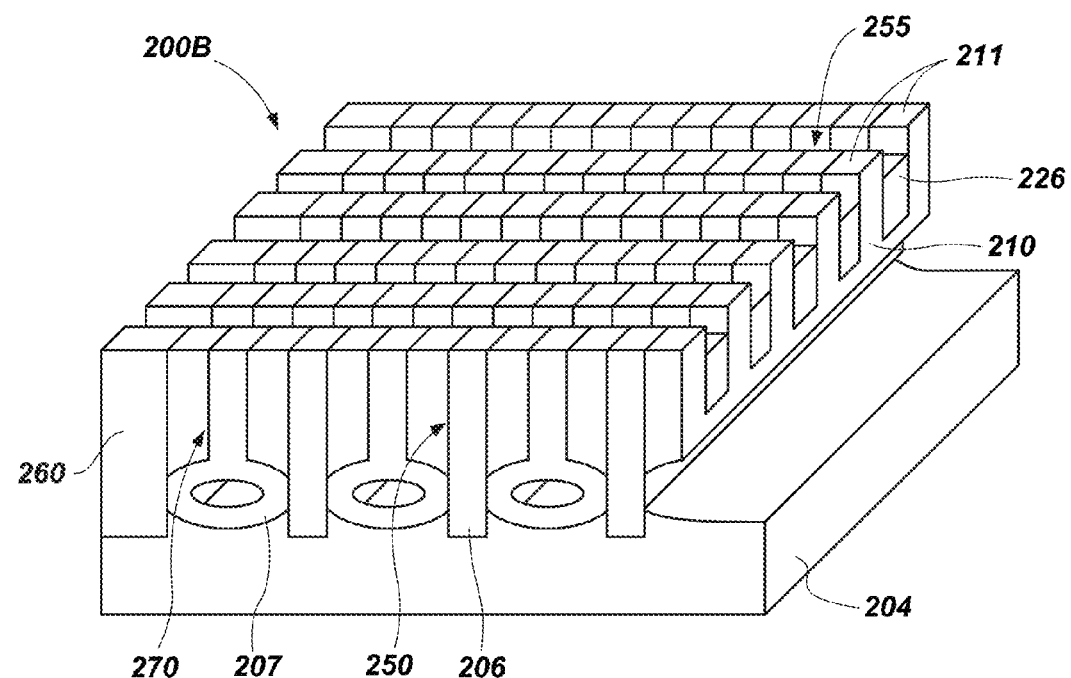
FIG. 16 illustrates an embodiment of a method for forming the semiconductor structure shown in FIG. 2B of the present disclosure.

FIG. 16 illustrates a method of forming the semiconductor structure 200B shown in FIG. 2B. First and second trenches 250, 270 may be formed in a substrate 204 and filled with first and second insulative materials 206, 207 and, optionally, STI structure(s) 260 may be formed, using a similar method as described with reference to FIG. 15. After forming the first and second trenches 250, 270, the bodies 210 of the substrate 204 may be defined by forming a plurality of second channels 255 extending in the second direction y substantially perpendicular to the first and second trenches 250, 270, which extend in the first direction x. The second channels 255 may be formed by removing portions of each of the substrate 204 and the first and second insulative materials 206, 207, as described with respect to FIG. 15. As shown in FIG. 16, the second channels 255 extend partially through each of the bodies 210 to form the pillars 211. FIG. 16 depicts the second channels 255 forming a U-shaped profile within the bodies 210; however, channels having various other profiles may also be formed, as will be recognized by one of ordinary skill in the art.

To form the semiconductor structure 200B shown in FIG. 2B, the gate dielectric 224 and the conductive gate 226 may be formed over surfaces exposed within the second channels 255, i.e., at least partially overlying sidewalls of the first channels 254 (FIG. 15) and a surface therebetween. The gate dielectric 224 may be formed from an oxide material, such as silicon dioxide, using a conventional deposition process, such as a CVD process, an ALD process or a PVD process. The conductive gate 226 may be formed over the gate dielectric 224, at least partially filling the first channels 254. The conductive gate 226 may be formed from a conductive material, such as, a metal or polysilicon, using a conventional deposition process.

Figure 17:
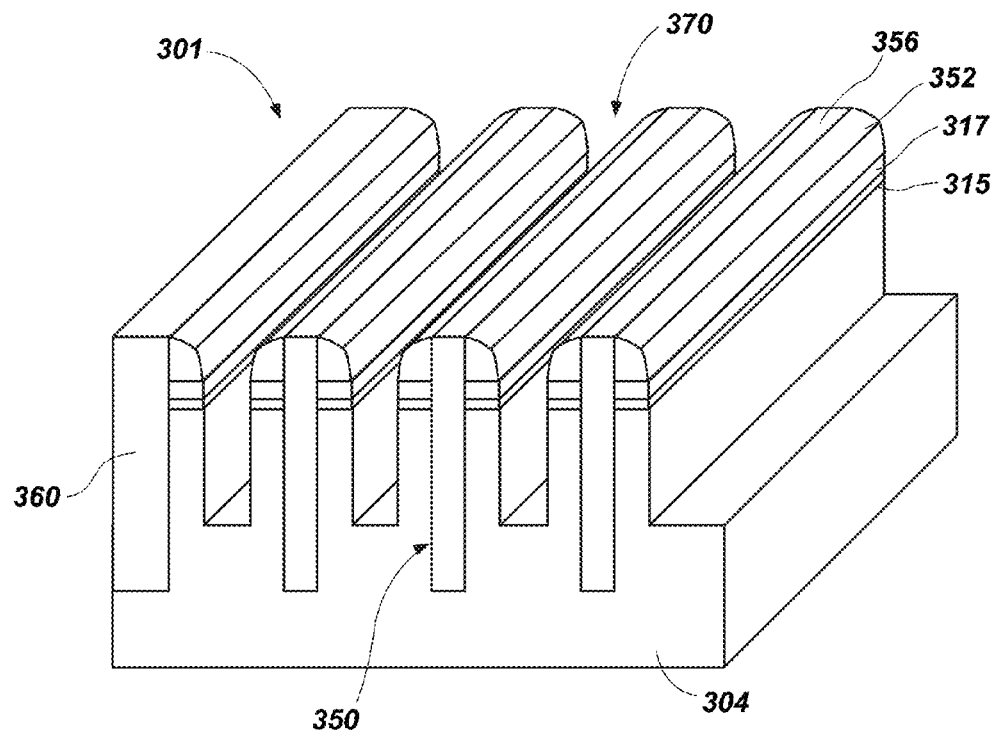
FIGS. 17 through 24 illustrate an embodiment of a method for forming the semiconductor structure shown in FIG. 3 of the present disclosure.

FIGS. 17 through 25 illustrate a method of forming the semiconductor structure 300 shown in FIG. 3. First and second trenches 350, 370 may be formed, the first trenches 350 may be filled with a first dielectric material 306, and, optionally, STI structure(s) 360 may be formed, using a similar method as used to form the first and second trenches 150, 170, to fill the first trenches 150 with the first insulative material 106, and to form the STI structure(s) 160 as described with reference to FIGS. 4 through 8. The first and second trenches 350, 370 of a semiconductor structure 301 may be formed though a first sacrificial material 315 and a second sacrificial material 317 overlying a substrate 304, rather than through the gate dielectric 114, the storage material 116, the barrier material 138, the etch stop material 140 and the sacrificial material 142 as described with respect to FIGS. 4 through 8. By way of example and not limitation, in embodiments in which the first sacrificial material 315 is formed from an oxide material, the second sacrificial material 317 may be formed from a nitride material. As shown in FIG. 17, the spacers 352 may overlie remaining portions of the first and second sacrificial materials 315, 317 and the substrate 304 between the first and second trenches 350, 370.

Figure 18:
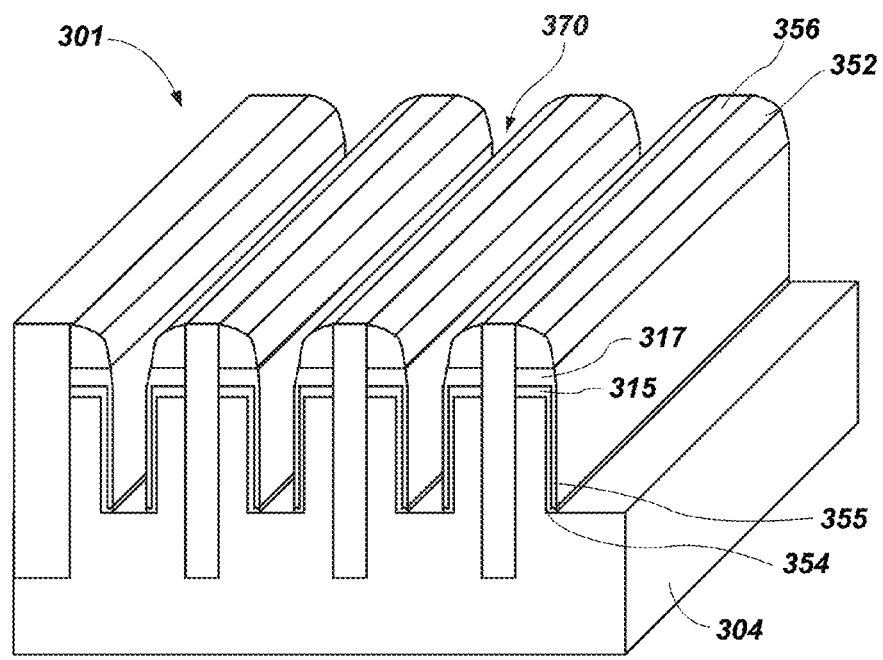

As shown in FIG. 18, a first liner 354 may be formed over exposed sidewalls of the second trenches 370, and a second liner 355 may be formed over surfaces of the first liner 354. The first liner 354 may be formed from a dielectric material, e.g., an oxide material or a nitride material, using a conventional deposition process, such as, a CVD process or a thermal oxidation process. For example, the first liner 354 may be formed from the same material as the first sacrificial material 315. The second liner 355 may then be formed over the first liner 354 within the second trenches 370. The second liner 355 may be formed from a dielectric material (e.g., an oxide material or a nitride material) using a conventional deposition process, such as, a CVD process or a thermal oxidation process. By way of example and not limitation, the second liner 355 may be formed from the same material as the second sacrificial material 317 and, additionally, may be formed from a material that may be selectively etched with respect to the first liner 354. In embodiments in which the first liner 354 and the first sacrificial material 315 are formed from an oxide material, the second liner 355 and the second sacrificial material 317 may be formed from a nitride material. Portions of the first and second liners 354, 355 may be removed to expose surfaces of the substrate 304. By way of example, a dry, anisotropic etch may remove the first and second liners 354, 355 from surfaces at a bottom of the second trenches 370 while leaving remaining portions of the first and second liners 354, 355 on the sidewalls of the second trenches 370. The first liner 354 and the second liner 355 may function as a mask for subsequent processing acts, which will be described in further detail.

Figure 19:
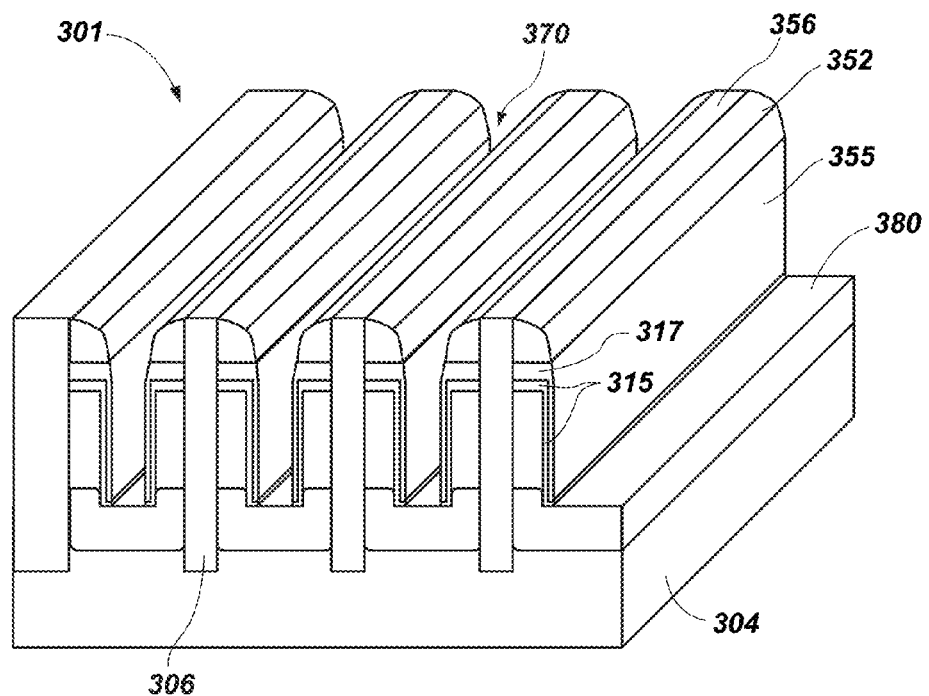

As shown in FIG. 19, the substrate 304 at or near the exposed bottom of the second trenches 370 may be doped to form doped regions 380, using methods such as those described with respect to FIG. 12. The doped regions 380 may extend from terminal ends of the second trenches 370 laterally between adjacent portions of first insulative materials 306.

Figure 20A:
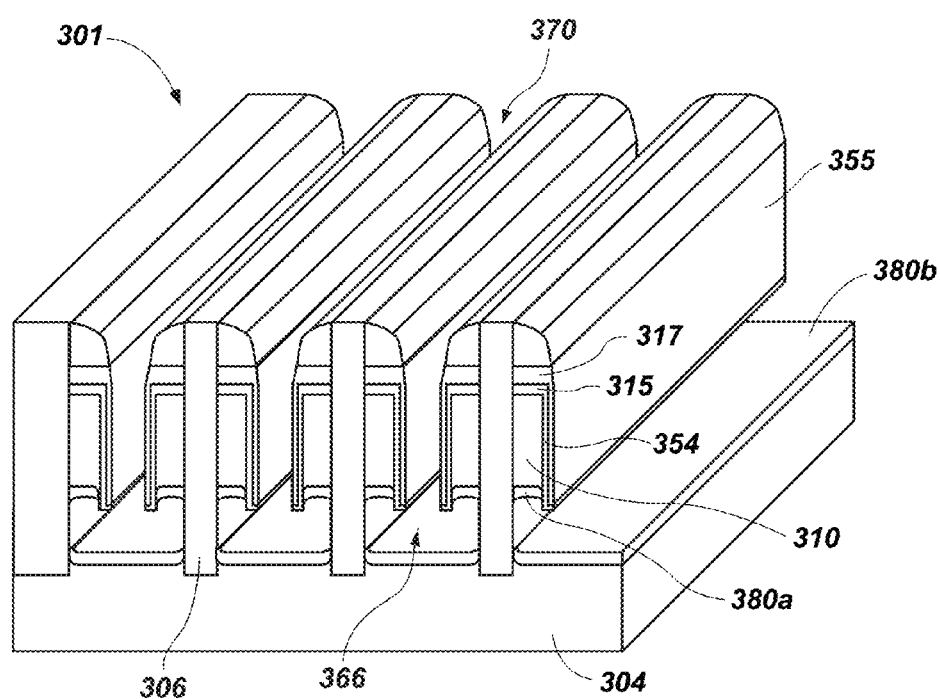
Figure 20B:
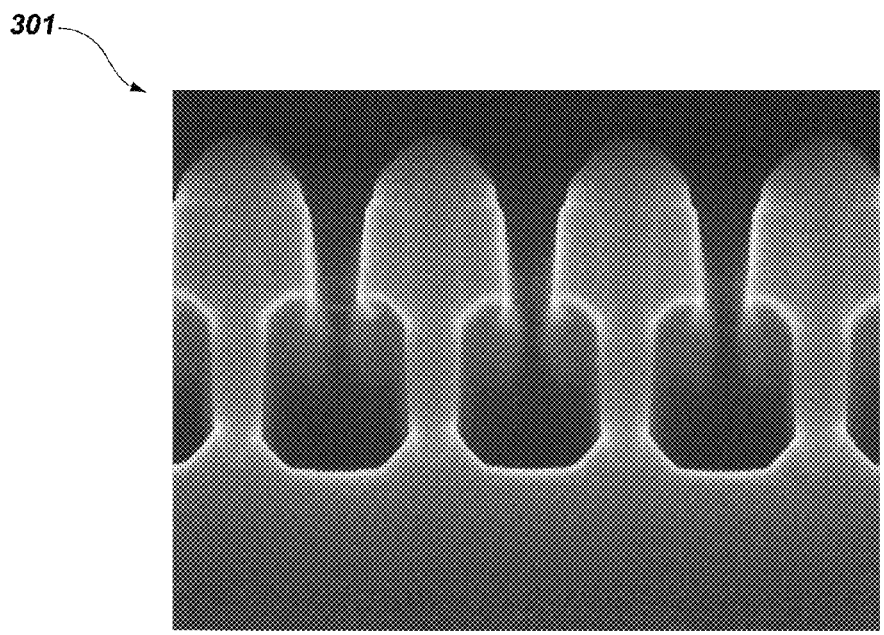

Referring now to FIG. 20A, at least a portion of each of the doped regions 380 (FIG. 19) may be removed to form cavities 366 flanked by portions of the doped regions 380a, 380b. By way of example and not limitation, the doped regions 380a, 380b are formed using a selective etching process that removes n-type silicon material more readily than the other materials, i.e., material of the first and second liners 354, 355 and the first and second sacrificial materials 315, 317. As another non-limiting example, the portions of the doped regions 380a, 380b may be removed using a conventional isotropic etching process. The cavities 366 may extend laterally under bodies 310 of the substrate 304 exposing surfaces of the first insulative material 306. The doped regions 380a, 380b may be doped with a different species than the bodies 310. For example, the doped regions 380a, 380b may be heavily doped with an n-type dopant, such as arsenic or phosphorous, and the bodies 310 may be lightly doped with a p-type dopant, such as boron. FIG. 20B is a scanning electron micrograph (SEM) of a semiconductor structure 301 formed using the methods described with respect to FIGS. 17 through 20A.

Figure 21:
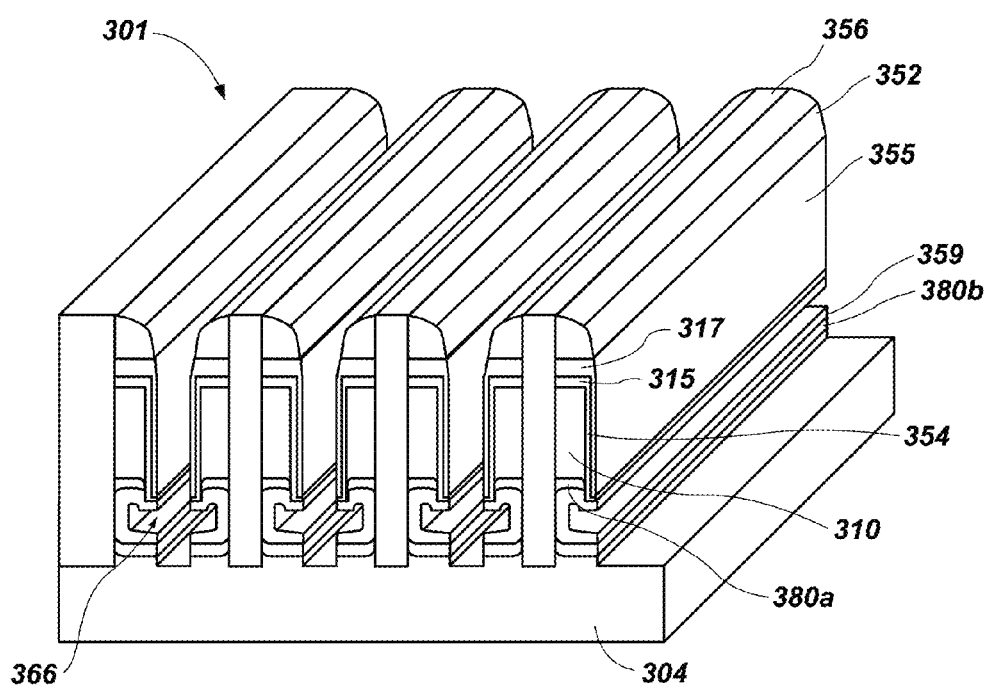

Referring now to FIG. 21, a conductive material 359 may be formed over surfaces within the cavities 366. i.e., over surfaces of the remaining portions of the doped regions 380a, 380b and surfaces of the first insulative material 306. By way of example, the conductive material 359 may be formed from a metal using a conventional deposition process, such as a CVD process. As previously discussed with respect to FIG. 3, the conductive material 359 may be used, for example, as a buried word line in a vertical cross point diode array or any other two- or three-terminal vertical semiconductor device, as will be appreciated by one of skill in the art.

Figure 22:
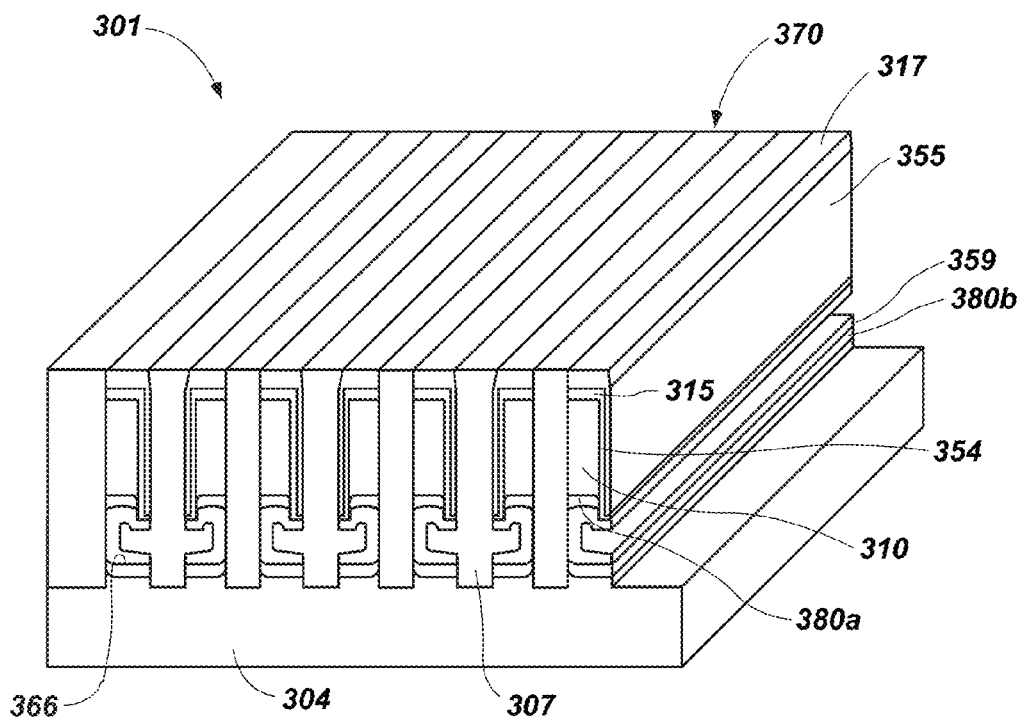

As shown in FIG. 22, the second trenches 370 and remaining portions of the cavities 366 may be filled with a second insulative material 307 and the spacers 352 and portions of material overlying the second sacrificial material 317 may be removed. For example, the second insulative material 307 may be formed over an entire surface of the semiconductor structure 301 substantially filling the second trenches 370 and, thereafter, portions of each of the second insulative material 307 and rails 356 of the first dielectric material and the spacers 352 overlying the second sacrificial material 317 may be removed. For example, such materials may be removed using a conventional planarization process wherein the second sacrificial material 317 acts as a stopping material.

Figure 23:
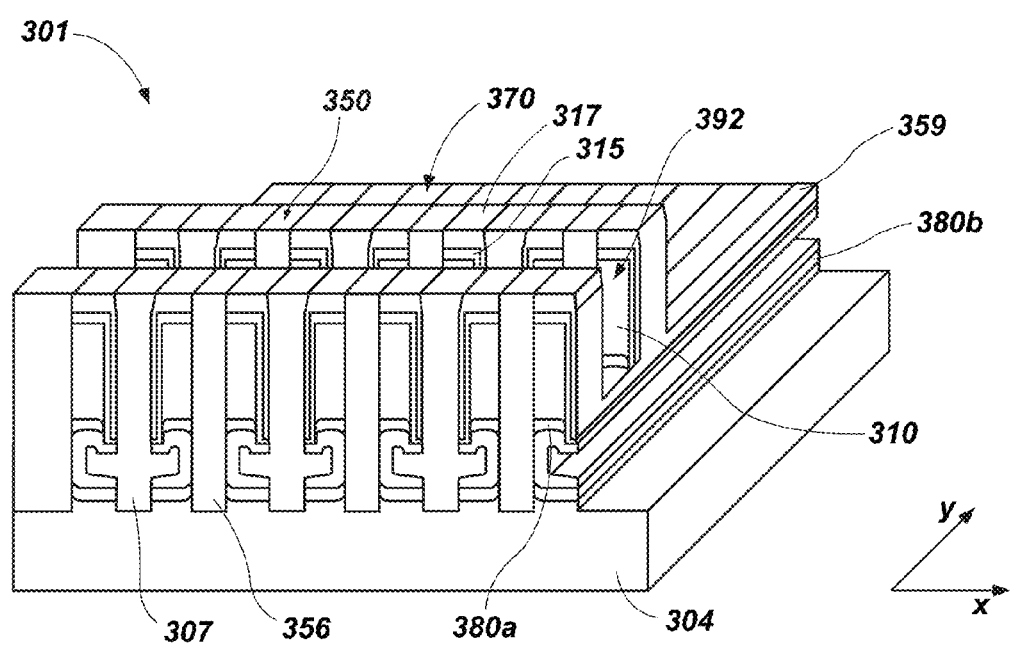

Referring now to FIG. 23, one or more channels 392 may be formed extending through the semiconductor structure 301 in the first direction x substantially perpendicular to the second direction y in which the first and second trenches 350, 370 were formed to form a plurality of bodies 310 of the substrate 304. An exposed region of the rails 356 of the first insulative material, the second insulative material 307 and the conductive material 359 therebetween may be formed in a periphery of the semiconductor structure 301. The channels 392 and the exposed region may be formed by conventional patterning and etching, such as by using conventional lithographic techniques. The channels 392 and the exposed region may be formed by removing portions of each of the rails 356 of the first insulative material, the second insulative material 307, the first and second sacrificial materials 315, 317, the bodies 310 and the doped regions 380a, 380b to expose surfaces of the conductive material 359.

Figure 24:
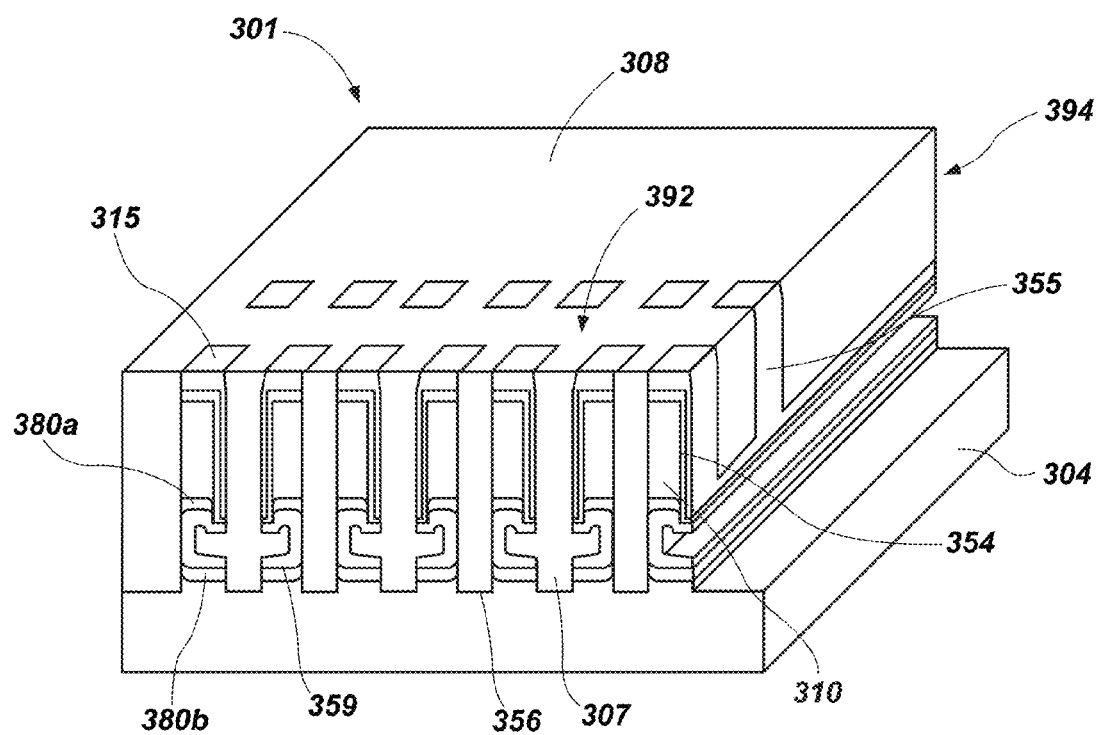

As shown in FIG. 24, the channels 392 and exposed region 394 may then be at least partially filled with a third insulative material 308. By way of example, the channels 392 and the exposed region may be filled by forming a dielectric material, such as silicon dioxide, over the semiconductor structure 301 using a conventional deposition process. Portions of the third insulative material 308 and the second sacrificial material 317 overlying the first sacrificial material 315 may then be removed using, for example, a conventional polishing process.

Referring back to FIG. 3, the semiconductor structure 300 may be formed by removing the first sacrificial material 315 (FIG. 24) and forming the second doped regions 382 (shown in broken lines) and the conductive lines 398. For example, the first sacrificial material 317 may be removed using a conventional etching process to expose surfaces of each of the bodies 310, which may leave an aperture overlying each of the bodies 310. By way of example and not limitation, the second doped regions 382 may be formed over the bodies 310 by forming a doped semiconductor material in each of the apertures remaining after removing the first sacrificial material 315. As another non-limiting example, the first sacrificial material 315 may be removed during the polishing process described with respect to FIG. 24 such that surfaces of each of the bodies 310 are exposed. Thereafter, the bodies 310 may be doped using a conventional method, such as an ion implantation process or a high temperature diffusion process, to form the second doped regions 382. By way of example and not limitation, the second doped regions 382 may be formed from p-type silicon. While the second doped regions 382 are shown in only a portion of the bodies 310 in FIG. 3, it is to be understood that the bodies 310 may be substantially completely doped.

Optionally, a storage medium 357 may be formed over the bodies 310. By way of example, the storage medium 357 may be formed from a high-k dielectric material, e.g., hafnium silicate, zirconium silicate, hafnium dioxide and zirconium dioxide, or a chalcopyrite, e.g., $GeS_2$, $CuS_2$, GeSbTe, etc. To form the semiconductor structure 300 shown in FIG. 3, the conductive lines 398 may be formed over exposed surfaces of the storage medium 357 and exposed surfaces of the first and second insulative materials 306, 307 therebetween. The conductive lines 398 may extend over bodies 310 aligned in the second direction y. For example, the conductive lines 398 may be formed by depositing a conductive material over the entire surface of the semiconductor structure 300 and, thereafter, patterning and removing portions of the conductive material to expose surfaces of the third dielectric material 308 therebetween. As another example, the conductive lines 398 may be formed using a conventional damascene process. For example, a sacrificial dielectric material (not shown) may be deposited over the semiconductor structure 300 and a pattern of apertures may be formed therein in locations at which the conductive lines 398 are to be formed using a conventional lithographic process. A conductive material may be formed over the semiconductor structure 300 to fill the apertures and a chemical mechanical polishing process may be used to remove portions of the conductive material overlying the sacrificial dielectric material to form the conductive lines 398.

The configuration of the semiconductor structures 100A, 100B, 200A, 200B, 300 described herein enables sufficient isolation between devices while reducing problems associated with such devices formed using conventional SOI substrates, such as, parasitic coupling, electrical leakage and physical stability. As shown in FIGS. 1A through 3, the semiconductor structures 100A, 100B, 200A, 200B, 300 each include bodies 110, 210, 310 of a semiconductor material spaced apart from the substrate 104, 204, 304 and from adjacent bodies 110, 210, 310 by dielectric materials (i.e., first insulative material 106, 206, 306, second insulative material 107, 207, 307 and, in the semiconductor structure 300, a third insulative material 308). The methods of the present disclosure, thus, enable fabricating of semiconductor structures 100A, 100B, 200A, 200B, 300 including substantially isolated the bodies 110, 210, 310 of semiconductor material without distortion or toppling of the substrates 104, 204, 304. Transistors of semiconductor devices, such as MOSFET devices, including their source, channel, drain, gate, ohmic contacts and channels, may be formed in isolated regions of silicon resulting. The methods of the present disclosure enable fabrication of isolated bodies of a semiconductor material while reducing the costs associated with fabrication and purchase of conventional SOI substrates.

CONCLUSION

In one embodiment, semiconductor structures are described that include a plurality of bodies comprising semiconductor material disposed over a substrate, at least a portion of each of the bodies of the plurality spaced apart from the substrate and at least one insulative material disposed between each of the bodies of the plurality.

In a further embodiment, semiconductor structures are described that include a gate dielectric overlying each of the plurality of bodies, a storage dielectric overlying portions of the gate dielectric and at least one gate overlying the storage material and comprising conductive material.

In another embodiment, semiconductor structures are described that include a plurality of volumes of dielectric material within a substrate and a plurality of bodies disposed between the plurality of volumes of dielectric material and spaced apart from the substrate by at least one void.

In yet another embodiment, semiconductor structures are described that include a plurality of bodies of semiconductor material disposed adjacent opposite sidewalls of a plurality of rails of a dielectric material within a substrate, a plurality of voids separating the plurality of bodies from the substrate and a conductive material disposed within the plurality of voids.

In yet another embodiment, methods of forming semiconductor structures are described. Such methods include forming a plurality of first trenches by removing portions of a semiconductor material, at least partially filling the plurality of first trenches with a first dielectric material, forming a plurality of second trenches, each of the second trenches of the plurality residing between adjacent trenches of the plurality of first trenches and laterally removing material from within each of the plurality of second trenches to form a plurality of openings extending under a plurality of volumes of the semiconductor material.

In yet another embodiment, methods of forming semiconductor structures are described that include filling a first plurality of trenches in a semiconductor material with a dielectric material to form a plurality of rails protruding from the semiconductor material, removing portions of the semiconductor material between each of the plurality of rails to form a second plurality of trenches in the semiconductor material, forming doped regions in portions of a substrate extending from ends of the second plurality of trenches and removing portions of the doped regions to expose surfaces of adjacent rails and from openings separating volumes of the semiconductor material.

While the invention is susceptible to various modifications and alternative forms, specific embodiments have been shown by way of example in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. A semiconductor structure, comprising:
bodies comprising semiconductor material disposed over a semiconductor substrate in an array region, the bodies aligned in a first direction and a second direction substantially perpendicular to the first direction, the bodies separated from the semiconductor substrate by a gap;
a first dielectric material directly on a first side of each body of the bodies and extending at least to the semiconductor substrate; and
a second dielectric material on a second, opposite side of each body of the bodies and disposed in the gap between each body and the semiconductor substrate.

2. The semiconductor structure of claim 1, wherein the gap has a thickness of between about 10 nm and about 30 nm.

3. The semiconductor structure of claim 1, wherein the second dielectric material extends at least to the semiconductor substrate.

4. The semiconductor structure of claim 1, wherein each of the bodies comprises semiconductor material and the semiconductor substrate comprises a silicon material.

5. The semiconductor structure of claim 1, wherein a unitary volume of the second dielectric material extends between and physically contacts adjacent volumes of the first dielectric material and physically contacts two adjacent bodies of the bodies comprising semiconductor material.

6. The semiconductor structure of claim 1, wherein each of the first and second dielectric materials comprises a silicon oxide material.

7. The semiconductor structure of claim 1, further comprising:
a gate dielectric material over each of the bodies; and
a storage material over the gate dielectric material.

8. The semiconductor structure of claim 7, wherein:
the gate dielectric material comprises at least one of an oxide material and a nitride material; and
the storage material comprises at least one of a conductive material and a charge-trapping material.

9. The semiconductor structure of claim 8, wherein:
the gate dielectric material comprises at least one of a gallium oxide material, a silicon dioxide material, an aluminum oxide material, a hafnium oxide material, a magnesium oxide material, a tantalum oxide material, an aluminum nitride material, and a silicon nitride material; and
the storage material comprises at least one of a conductive material and a charge-trapping material.

10. The semiconductor structure of claim 1, wherein the second dielectric material disposed in the gap between each body and the semiconductor substrate fully fills the gap between each body and the semiconductor substrate.

11. A method of forming a semiconductor structure, comprising:
forming a sacrificial material having a thickness of about 30 nm or less between a first, lower portion of a semiconductor substrate and a second, upper portion of a semiconductor substrate;
removing portions of the sacrificial material and the second, upper portion of the semiconductor substrate to form first trenches;
completely filling the first trenches with a first dielectric material to form rails of the first dielectric material;
removing portions of the sacrificial material and the second, upper portion of the semiconductor substrate between each of the rails of the first dielectric material to form second trenches;
removing the sacrificial material between the first trenches and second trenches to form openings having a thickness of about 30 nm or less separating bodies of the second, upper portion of the semiconductor substrate from the first, lower portion of the semiconductor substrate; and
at least partially filling the second trenches with a second dielectric material.

12. The method of claim 11, wherein forming a sacrificial material comprises forming a material that is selectively removable with respect to the first and second portions of the semiconductor substrate.

13. The method of claim 11, wherein forming a sacrificial material comprises forming a silicon germanium material.

14. The method of claim 13, wherein forming a silicon germanium material comprises epitaxially growing the silicon germanium material over the first, lower portion of the semiconductor substrate.

15. The method of claim 14, further comprising forming the second, upper portion of the semiconductor substrate over the silicon germanium material.

16. The method of claim 15, wherein forming the second, upper portion of the semiconductor substrate over the silicon germanium material comprises forming the second, upper portion of the semiconductor substrate having a thickness of between about 30 nm and about 80 nm.

17. The method of claim 15, wherein forming the second, upper portion of the semiconductor substrate over the silicon germanium material comprises epitaxially growing a single crystal of a silicon material over the silicon germanium material.

18. The method of claim 11, wherein at least partially filling the second trenches with a second dielectric material comprises completely filling the second trenches with a second dielectric material.

19. The method of claim 11, wherein at least partially filling the second trenches with a second dielectric material comprises at least partially filling the openings with the second dielectric material.

20. The method of claim 11, further comprising:
forming a gate dielectric material over the second, upper portion of the semiconductor substrate; and
forming a storage material over the gate dielectric.

21. A semiconductor structure, comprising:
bodies comprising semiconductor material over a semiconductor substrate in an array region, the bodies aligned in a first direction and a second direction substantially perpendicular to the first direction, the bodies separated from the semiconductor substrate by a gap;
a first dielectric material on a first side of each body of the bodies and extending at least to the semiconductor substrate; and
a second dielectric material on a second, opposite side of each body of the bodies and disposed in the gap between each body and the semiconductor substrate, the second dielectric material extending beneath each body of the bodies and the first dielectric material not extending beneath each body of the bodies.

* * * * *